(12) United States Patent
Chawla et al.

(10) Patent No.: US 9,952,272 B2
(45) Date of Patent: Apr. 24, 2018

(54) FIXTURE FOR IN SITU ELECTROMIGRATION TESTING DURING X-RAY MICROTOMOGRAPHY

(71) Applicants: Nikhilesh Chawla, Tempe, AZ (US); James E Mertens, Tempe, AZ (US)

(72) Inventors: Nikhilesh Chawla, Tempe, AZ (US); James E Mertens, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 62 days.

(21) Appl. No.: 14/958,354

(22) Filed: Dec. 3, 2015

(65) Prior Publication Data

US 2016/0169782 A1 Jun. 16, 2016

Related U.S. Application Data

(60) Provisional application No. 62/090,010, filed on Dec. 10, 2014.

(51) Int. Cl.
  *G01N 21/01* (2006.01)
  *G01R 31/12* (2006.01)
  (Continued)

(52) U.S. Cl.
  CPC .......... *G01R 31/1218* (2013.01); *H01J 37/20* (2013.01); *H01J 37/28* (2013.01);
  (Continued)

(58) Field of Classification Search
  CPC .......... G01N 23/046; G01N 1/44; G01T 7/00; G01T 1/1603; G01T 7/10; H01J 37/28; H01J 37/20; G01R 31/1218
  (Continued)

(56) References Cited

U.S. PATENT DOCUMENTS

| | | | |
|---|---|---|---|
| 5,436,567 A | | 7/1995 | Wexler et al. |
| 5,639,368 A | * | 6/1997 | Davis .................. B01D 61/425 204/210 |

(Continued)

OTHER PUBLICATIONS

Teramoto et. al., "Automated Solder Inspection Technique for BGA-Mounted Substrates by Means of Oblique Computed Tomography," IEEE Trans. Electron. Packag. Manufact. 30, 4, pp. 285-292 (2007).

(Continued)

*Primary Examiner* — Hoa Pham
(74) *Attorney, Agent, or Firm* — Quarles & Brady LLP

(57) ABSTRACT

Systems and fixtures for mounting, under mechanical constraint, wire-like or fiber-like samples of a high aspect ratio and down to 100 micrometers in diameter are disclosed. A region of interest along the length of the sample resides between and beyond a mechanical constraint on either side, allowing access to the region of interest for a wide number of characterization probes. The fixture may provide electrical isolation between two retaining blocks by means of a dielectric support member. The design may achieve minimal thermal expansion along the length of the sample by the material selection for the dielectric support member. Electrical contact may be introduced to the sample through conductive constraints in the retaining blocks. The fixture may have a minimal size perpendicular to the length axis of the sample to facilitate high probe fluxes when a diverging probe is used. The fixture may provide high x-ray transparency between the retaining blocks. The systems and fixtures as described therefore may provide a means for performing electrical and thermal testing on samples, including but not limited to solder butt-joints, across multimodal in situ characterization and imaging techniques to analyze dynamic electromigration.

17 Claims, 18 Drawing Sheets

(51) Int. Cl.
*H01J 37/28* (2006.01)
*H01J 37/20* (2006.01)
*G01R 31/28* (2006.01)

(52) U.S. Cl.
CPC ... *G01R 31/2858* (2013.01); *H01J 2237/2007* (2013.01); *H01J 2237/2008* (2013.01)

(58) Field of Classification Search
USPC .................................. 356/244, 246, 432–440
See application file for complete search history.

(56) References Cited

U.S. PATENT DOCUMENTS

| | | | |
|---|---|---|---|
| 6,762,613 | B1 | 7/2004 | Yao et al. |
| 6,856,157 | B2 | 2/2005 | Martter et al. |
| 7,215,736 | B1 | 5/2007 | Wang et al. |
| 7,835,561 | B2 * | 11/2010 | Meyer .................. G06T 11/005 356/343 |
| 8,237,458 | B2 | 8/2012 | Federspiel |
| 2006/0033515 | A1 | 2/2006 | Haba |
| 2011/0037477 | A1 | 2/2011 | Hein |
| 2014/0232428 | A1 | 8/2014 | Chen et al. |
| 2015/0160354 | A1 * | 6/2015 | Mertens ............... G01N 23/046 378/9 |

OTHER PUBLICATIONS

Dudek et. al., "Three-dimensional (3D) visualization of reflow porosity and modeling of deformation in Pb-free solder joints," Mater. Charact, vol. 61, 4, 433-439 (2010).
Jiang et. al., "Three-dimensional (3D) microstructural characterization and quantification of reflow porosity in Sn-rich alloy/copper joints by X-ray tomography," Mater. Charact. 62(10), pp. 970-975 (2011).
Li et. al., "Lead-Free Solder Joint Void Evolution During Multiple Subsequent High-Temperature Reflows," {IEEE} Trans. Device Mat. Rel. 12(2), pp. 494-500 (2012).
Tian et. al., "Quantitative X-ray microtomography study of 3-D void growth induced by electromigration in eutectic SnPb flip-chip solder joints," Scripta Mater. 65(7), pp. 646-649 (2011).
Sayama et. al., "Nondestructive Evaluation of Thermal Phase Growth in Solder Ball Microjoints by Synchrotron Radiation X-Ray Microtomography," J. Electron. Packag. 129, 4, pp. 434-439 (2007).
Yazzie et. al., "Multiscale Microstructural Characterization of Sn-rich Alloys by Three Dimensional (3D) X-ray Synchrotron Tomography and Focused Ion Beam (FIB) Tomography," Mater. Charact. 70, pp. 33-41 (2012).
Maleki et. al., "Isothermal Ageing of SnAgCu Solder Alloys: Three-Dimensional Morphometry Analysis of Microstructural Evolution and Its Effects on Mechanical Response," J. Electron. Mater. 43, 4, 1026-1042 (2014).
J. Bertheau,et al., "Reflow processes in micro-bumps studied by synchrotron X-ray projection nanotomography", Microelectron. Eng. 113 (2014) pp. 123-129.
Tsuritani et. al., "Application of Synchrotron Radiation X-Ray Microtomography to Nondestructive Evaluation of Thermal Fatigue Process in Flip Chip Interconnects," J. Electron. Packag. 133, 2, pp. 021007 (2011).
Yang et. al., "Electromigration and thermomigration behavior of flip chip solder joints in high current density packages" J. Mater. Res., 23, 9, 2008.
Ye et. al., "Deformation of solder joints under current stressing and numerical simulation—I," Int. J. of Solids and Sturct, 41, 4939-58 (2004).
Zhang et. al., "Current-induced weakening of Sn3.5Ag0.7Cu Pb-free solder," Scripta Materialia, 56, 381-384, (2007).
Yue et. al., "Electromigration induced microstructure evolution and damage inasymmetric Cu/Sn-58Bi/Cu solder interconnect under current stress," Trans. Nonferrous Met. Soc. China., 24, 1619-1628 (2014).

Du et. al., "Effect of Electromigration on Interfacial Reactions in 90Sn-10SbPb-Free Solder Joints," J. Elec. Mater. 38, 11, 2398-2404 (2009).
Aubel et. al., "Highly Accelerated Electromigration Lifetime Test (HALT) of Copper," IEEE Trans. On Device and Mater. Reliab., vol. 3, 4, 213-217 (2009).
Siewert et al., "Test Procedures for Developing Solder Data", NIST Special Publication 960-8, 2002.
Dudek, et al; Three-dimensional (3D) microstructure visualization of LaSn3 intermetallics in a novel Sn-rich rare-earth-containing solder; Materials Characterization 59 (2008) 1364-1358.
Williams, et al; Damage Evolution in SiC particle reinforced Al alloy matrix composites by X-ray synchrotron tomography; Acta Materialia 58 (2010) 6194-6205.
Padilla, et al; Quantifying the effect of porosity on the evolution of deformation and damage in Sn-based solder joints by X-ray microtomography and microstructure-based finite element modeling; Acta Materialia 60 (2012) 4017-4026.
Flynn et al; Microfocus X-ray sources for 3D microtomography; Nuclear Instruments and Methods in Physics Research A 353 (1994) 312-315.
Feldkamp et al; Practical cone-beam algorithm; J. Opt. Soc. Am. A/Vol. 1, No. 6/Jun. 1984; pp. 612-619.
Schena Et Akl; Detecting microdiamonds in kimberlite drill-hole cores by computed tomography; Int. J. Miner. Process. 75 (2005) 173-188.
Uhlmann et al; Characterization and comparison of direct and indirect converting X-ray detectors for non-destructive testing (NDT) in low-energy and high-resolution applications; Nuclear Instruments and Methods in Physics Research A 591 (2008) 46-49.
Koch et al; X-ray imaging with submicrometer resolution employing transparent luminescent screens; J. Opt. Soc. Am. A/ Vol. 15, No. 7/Jul. 1998; pp. 1940-1951.
Uesugi et al; Comparison of lens- and fiber-coupled CCD detectors for X-ray computed tomography; Journal of Synchrotron Radiation; Received Sep. 1, 2010, Accepted Oct. 31, 2010; pp. 217-223.
Dierick et al; The use of 2D pixel detectors in micro- and nano-CT applications; Nuclear Instruments and Methods in Physics Research A 591 (2008) 255-259.
Packham, Daniel; Testing and Characterisation of Scintillator Materials for X-ray Detection; University of Surrey; Faculty of Engineering and Physical Sciences, Department of Physics; Feb. 2010; 136 pages.
Schena et al; Conceiving a high resolution and fast X-ray CT system for imaging fine multi-phase mineral particles and retrieving mineral liberation spectra; Int. J. Miner. Process. 84 (2007) 327-336.
Mueller et al; Anti-Aliased Three-Dimensional Cone-Beam Reconstruction of Low-Contrast Objects with Algebraic Methods; IEEE Transactions on Medical Imaging, Vol. 18, No. 6, Jun. 1999; pp. 519-537.
Taylor et al; Resolution, Artifacts and the Design of Computed Tomography Systems; Section VIII. Tomography; Nuclear Instruments and Methods in Physics Research A242 (1986) 603-609; North-Holland. Amsterdam.
Masschaele et al; UGCT: New X-ray radiography and tomography facility; Nuclear Instruments and Methods in Physics Research A 580 (2007) 266-269.
Martin et al; Recent developments in X-ray imaging with micrometer spatial resolution; Journal of Synchrotron Radiation; Received Jun. 21, 2005, Accepted Jan. 5, 2006; pp. 180-194.
Sato, et al; Development of a high-resolution x-ray imaging system with a charge-coupled-device detector coupled with crystal x-ray magnifiers; Review of Scientific Instruments 71, 4449 (2000).
Tous et al; High-resolution X-ray imaging CCD camera based on a thin scintillator screen; Radiation Measurements 42 (2007) 925-928.
Graafsma et al; Detectors for Synchrotron Tomography; pp. 277-302; not dated.
Aslund et al; Detectors for the Future of X-Ray Imaging; Radiation Protection Dosimetry (2010), vol. 139, No. 1-3, pp. 327-333; Advance Access publication Mar. 5, 2010.
Valais et al; Comparative evaluation of single crystal scintillators under x-ray imaging conditions; 4th International Conference on

(56) References Cited

OTHER PUBLICATIONS

Imaging Technologies in Biomedical Sciences, From Medical Images to Clinical Information—Bridging the Gap, Sep. 22-28, 2007, Milos Island, Greece; Published by IOP Publishing for SISSA; 7 pages.
Williams; et al; On the Correlation Between Fatigue Striation Spacing and Crack Growth Rate: A Three-Dimensional (3-D) X-ray Synchrotron Tomography Study; The Minerals, Metals & Materials Society and ASM International 2011; vol. 42A, Dec. 2011-3845.
Williams et al; Characterization of Damage Evolution in SiC Particle Reinforced Al Alloy Matrix Composites by In-Situ X-Ray Synchrotron Tomography; The Minerals, Metals & Materials Society and ASM International 2011; vol. 42A, Oct. 2011-2999.
Stampanoni et al; High resolution X-ray detector for synchrotron-based microtomography; Nuclear Instruments and Methods in Physics Research A 491 (2002) 291-301.
Mertens et al; Development of a lab-scale, high-resolution, tube-generated X-ray computed-tomography system for three-dimensional (3D) materials characterization; Materials Characterization 92 (2014) 36-48.
Pan et al; Ring Artifact Removal for Micro-Tomography in Synchrotron Radiation; Medical Imaging 2012: Physics of Medical Imaging, edited by Norbert J. Pelc, Robert M. Nishikawa, Bruce R. Whiting, Proc. of SPIE vol. 8313.
Sadi et al; Removal ofringartifactsincomputedtomographicimagingusingiterative center weighted median filter; Computers inBiologyandMedicine40(2010)109-118.
Anas et al; Classification of ring artifacts for their effective removal using type adaptive correction schemes; Computers inBiologyandMedicine41(2011)390-401.
Lee et al; Heat Effect and Impact Resistance during Electromigration on Cu-Sn Interconnections; Electronic Materials Letters, vol. 2, No. 3 (2006), pp. 157-160.
Burke, E.A.; Gamma-Induced Noise in CCDs; IEEE Transactions on Nuclear Science, vol. NS-28, No. 6, Dec. 1981; pp. 4067-4073.
Hardy, Timothy D; Effects of Radiation Damage on Scientific Charge Coupled Devices; Advances in Imaging and Electron Physics, 1999; vol. 106, pp. 1-96.
Parish, M.A.; Development of algorithms for on-focal plane gamma circumvention and time delay integration; SPIE vol. 1339 Materials, Devices, Techniques, and Applications for Z-Plane Focal Plane Array Technology II (1990); pp. 120-127.
Hopkins, G.R.; Radiation Effects on Solid State Imaging; Radia:. Phys. Chem. vol. 43, No. 1/2, pp. 79-91, 1994.
Bosiers et al; Technical challenges and recent progress in CCD imagers; Nuclear Instruments and Methods in Physics Research A 565 (2006) 148-156.
Marshall et al; CCD Radiation Effects and Test Issues for Satellite Designers; Oct. 6, 2003; pp. 1-43.
Sijbers et al; Reduction of ring artefacts in high resolution micro-CT reconstructions; Institute of Physics Publishing, Physics in Medicine and Biology; Phys. Med. Biol. 49 (2004); N247-N253.
Satyanarayan, K.N. Prabhu; Reactive wetting, evolution of interfacial and bulk IMCs and their effect on mechanical properties of eutectic Sn-Cu solder alloy; Advances in Colloid and Interface Science 166 (2011) 87-118.
Mertens et al; Note: Design and construction of a multi-scale, high-resolution, tube-generated X-Ray computed-tomography system for three-dimensional (3D) imaging; Review of Scientific Instruments 85, 016103 (2014); 4 pages.
Mertens et al; A Study of Pb-Rich Dendrites in a Near-Eutectic 63Sn-37Pb Solder Microstructure via Laboratory-Scale Micro X-ray Computed Tomography (uCT); Journal of Electronic Materials, vol. 43, No. 12, 2014; pp. 4442-4456.
Kammer, et al; The morphological evolution of dendritic microstructures during coarsening; Acta Materialia 54 (2006) 1549-1558.
Sa, et al; The effect of solidification variables on tertiary dendrite arm spacing in unsteady-state directional solidification of Sn-Pb and Al-Cu alloys; Materials Science and Engineering A 373 (2004) 131-138; pp. 131-138.
Netto De Souza, et al; The correlation between thermal variables and secondary dendrite arm spacing during solidification of horizontal cylinders of Sn-Pb alloys; Journal of Alloys and Compounds 399 (2005) 110-117.
Xie et al; Electromigration Damage Characterization in Sn-3.9Ag-0.7Cu and Sn-3.9Ag-0.7Cu-0.5Ce Solder Joints by Three-Dimensional X-ray Tomography and Scanning Electron Microscopy; Journal of Electronic Materials, vol. 43, No. 1, 2014; pp. 33-42.
Zhang et al; Evaluation of Constant Voltage Testing for Electromigration Study; 2013 IEEE; pp. EM.3.1-EM.3.4.
Syed, et al; Flip Chip Electromigration Reliability: A comparison of Cu Pillar, High Pb, SnAg, and SnPb Bump Structures; IMAPS Device Packaging Conference 2010; pp. 000166-000171.
Basaran et al; Electromigration time to failure of SnAgCuNi solder joints; Journal of Applied Physics 106, 013707(2009); 1-10.
Chen et al; Electromigration and Thermomigration in Pb-Free Flip-Chip Solder Joints; Annu. Rev. Mater. Res. 2010.40:531-555.
Gan et al; Electromigration in Solder Joints and Solder Lines; JOM, Jun. 2002; pp. 34-37.
Liang et al; Blocking hillock and whisker growth by intermetallic compound formation in Sn-0.7Cu flip chip solder joints under electromigration; Journal of Applied Physics 107, 093715 (2010).
Ke et al; Analysis and experimental verification of the competing degradation mechanisms for solder joints under electron current stressing; Acta Materialia 59 (2011) 2462-2468.

\* cited by examiner

FIXTURE FOR IN SITU ELECTROMIGRATION TESTING DURING X-RAY MICROTOMOGRAPHY

CROSS-REFERENCE TO RELATED APPLICATIONS

This application claims priority to U.S. Provisional Patent Application No. 62/090,010 filed Dec. 10, 2014, the contents of which are hereby incorporated by reference for all purposes as if set forth in their entirety herein.

BACKGROUND OF THE INVENTION

The field of the invention is systems and methods for microelectronic packaging. More particularly, the invention relates to the study of electromigration in micro-scale solder volumes, and the characterization of three-dimensional solder microstructures using micro x-ray computed tomography. The systems and methods utilize the observation of the evolution of three-dimensional microstructures in situ under a wide range of characterization modes.

Observing the microevolution of a sample is useful in many applications, for example microelectronic packaging. In microelectronic packages, an array of interconnects which are both electrical and mechanical have been used between the die and the package substrate as well as between the package substrate and a printed circuit board (PCB) to which the package is mounted. In flip-chip architectures, solder volumes with individual diameters of approximately 50 μm have been used to mount a die to a substrate. In mounting a package to a PCB, a ball-grid-array (BGA) of solder volumes, with individual diameters of approximately 500 μm, has been used. One significant long-term reliability concern with micro-scale solder volumes involves electromigration induced damage of the solder interconnects, established, in part, by the small conductor cross section within these architectures. Electromigration is the phenomenon of material migration under an applied electric field. The dominant electrical carriers are electrons, which move from the cathode toward the anode and cause a momentum exchange with thermally activated metal ions toward the anode yielding an "electron wind" force. It has been observed that at high current densities the electron wind force is substantially greater than, and opposite to, the electrostatic force, and thus is the dominating force on metal ions in the conductor.

A relatively small cross section implies high current density for a particular applied current magnitude. This effect may be enhanced by current crowding, thermomigration, the high concentration of vacancies in the low-melting temperature solder systems leading to self diffusion induced voiding, the rapid diffusion of, for example, copper (a common substrate metal) through the solder by interstitial mechanisms even at low temperature, and current induced Joule heating. Joule heating may cause aging effects on the solder grain structure and the formation of substrate-solder intermetallic compounds both at the interface and in the solder interior. Due to the highly anisotropic nature of tin, the crystallographic influence at small volumes is enhanced as the number of grains is reduced. It has been observed that solder interconnects with the c-axis parallel to the electron flow experience a much higher consumption rate of the under-bump-metallization (UBM) and reduced life.

With the above effects in mind, failure at the solder level within real packages is extremely complex. The microstructural evolution in an individual solder volume operating in an industrial package will conceivably depend on the electrical interconnectivity of the solder interconnects, the temperature and thermal gradient in the package, evolution in neighboring solders, the solder size and composition used, the substrate chemistry, and the thermal processing and heat treatment of the package and/or solder. Although previous research on electromigration induced material evolution in solders has been performed on actual packages or package-like testing structures, tests may also be conducted using individual solder volumes. Testing of individual solder volumes has the advantage of effectively reducing peripheral influences in the test and isolating material and environmental effects. However, the frailness of the single micro-joint in a free-standing butt-joint makes it extremely challenging to perform characterization, imaging, and testing.

SUMMARY OF THE INVENTION

The fixture of this disclosure enables the study of microstructural evolution and damage, during thermal excursions and electromigration, through a combination of several techniques such as x-ray microtomography (XCT) and electron back-scattered diffraction (EBSD) in a scanning electron microscope (SEM). This type of multi-modal characterization has become increasingly important in materials science mainly due to the large range of feature/defect sizes present within a given material (e.g., macroscopic voiding, microcracking, and grain structure). Each different characterization technique spans a limited length scale, and a single characterization technique cannot provide all of the critical structural information necessary for analysis.

This disclosure is directed to a fixture which enables a wide range of in situ testing, previously believed to be impossible, more challenging, or less versatile than the test vehicles implemented before. The fixture's design may advantageously enable the application of electrical current, temperature control through two modes, and minimal Joule heating of the sample during testing. Further, the fixture may be compatible with surface (2D) characterization techniques including optical microscopy (OM), SEM based analyses, high-resolution XCT imaging, and orientation image mapping (OIM) by EBSD in a SEM. Although these modes are the focus of the experiments performed with the fixture, other characterization and imaging techniques are possible with the fixture, such as energy dispersive spectroscopy (EDS) or x-ray diffractometry (XRD). Although solder volume samples were the focus of the experiments detailed below, the fixture design disclosed may apply to any wire-like sample, and has applications in not only electromigration studies but thermal studies as well. Further, the disclosed fixture may be especially advantageous in the semiconductor industry for performing product development and failure analyses.

The fixture design may facilitate accelerated electromigration testing of wire-like samples with in situ imaging capability. As described in the experiments below, this fixture design has enabled microstructural evolution studies in microscale (100 μm-500 μm in dimension) solder volumes. The fixture allows application of thermal and electrical stimulus to wire-like solders in situ during multimodal characterization. Grain orientation image maps (OIMs) may be obtained for in situ crystallographic microstructural analysis of the test volumes. The fixture may also be used with nondestructive and three-dimensional XCT analysis of microstructure volumes. The functional advantages of the fixture are accomplished through its particular form, described in detail herein.

DETAILED DESCRIPTION OF THE INVENTION

Described here is a system for performing accelerated electromigration testing (elevated temperature and high current density) on wire-like samples or specimens. The system provides mounting on a fixture, under mechanical constraint, wire-like (or fiber-like) samples of a high aspect ratio and down to 100 micrometers in diameter. A region of interest along the length of the sample may reside between and beyond a mechanical constraint on either side, allowing access to the region of interest for a wide number of characterization probes. The system may further provide electrical isolation between the two supporting halves by means of a dielectric support member. The design for the fixture achieves minimal thermal expansion along the length of the sample by the material selection for the dielectric support member. Additionally, the fixture may provide electrical contact to the sample via the design of the chosen conductive constraints. For example, the system may include a minimal spacing perpendicular to the length axis of the sample to facilitate high probe fluxes when a diverging probe is used. High x-ray transparency between the two restraining blocks may also be provided. Thus, a means for performing electrical and thermal testing on samples, including but not limited to solder butt-joints, may be provided.

Figure 1:
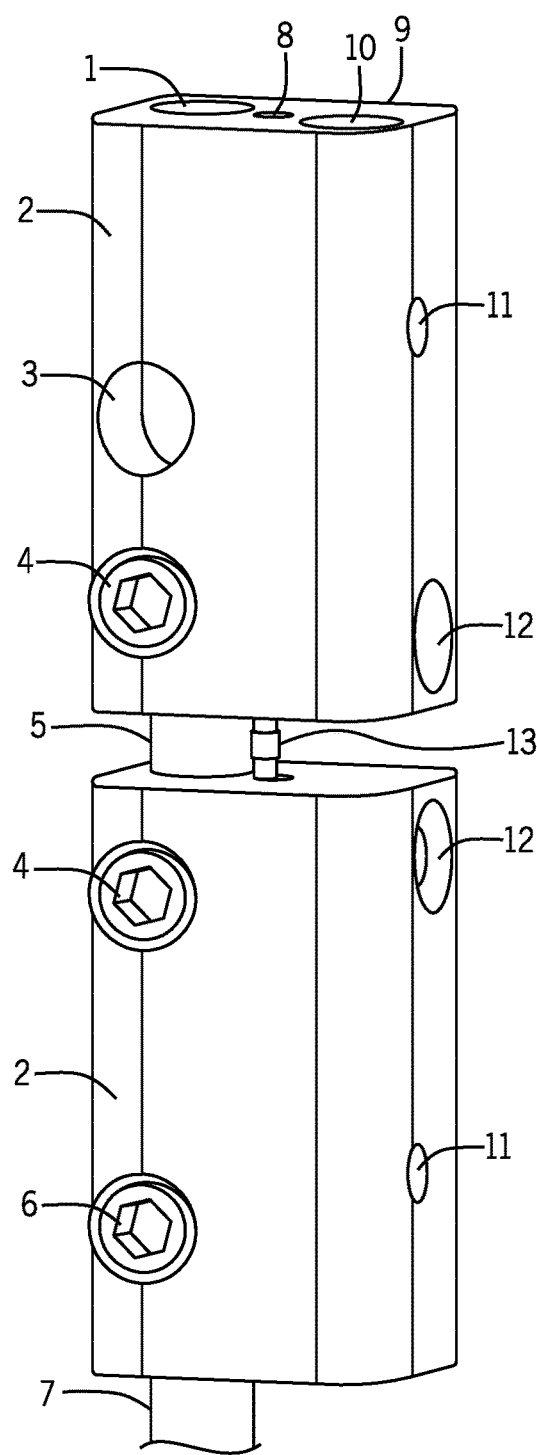
FIG. 1 shows an example of a fixture for in situ electromigration imaging.
Figure 2A:
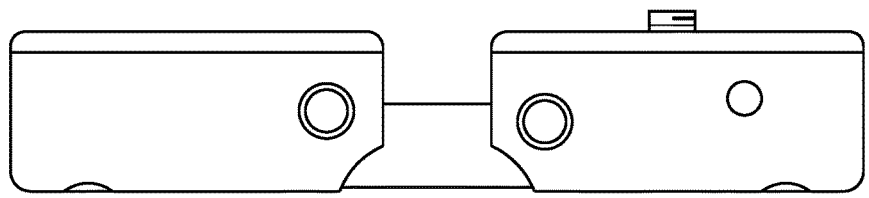
FIG. 2 shows several views of an example prototype of the assembled fixture.
Figure 2B:
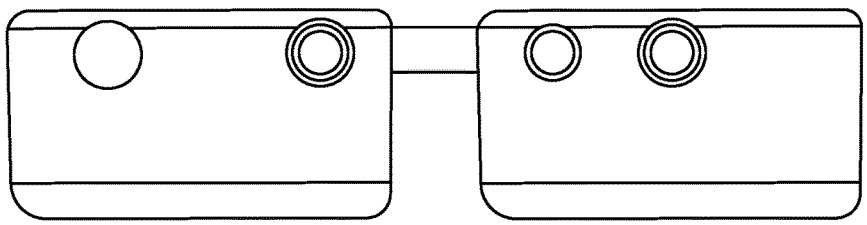
Figure 2C:
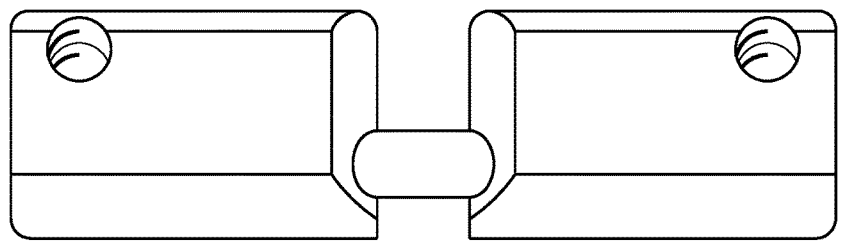
Figure 2D:
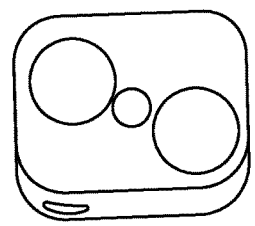
Figure 2E:
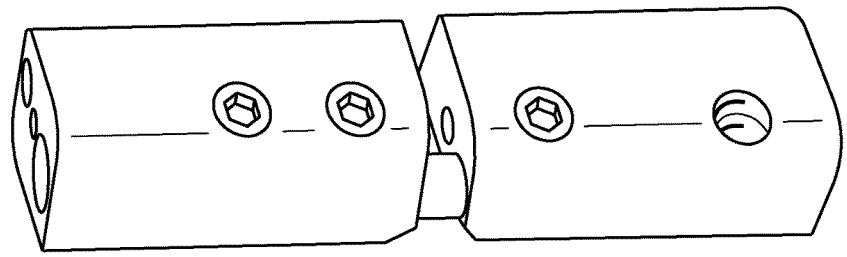

A system and fixture for the study of electromigration damage in single-sample solder volumes at elevated temperature using in situ μXCT, optical microscopy techniques, and electron microscopy techniques is also provided. More specifically, as shown in FIG. 1, a sample electromigration fixture may include retaining blocks 2 into which a sample may be affixed. The retaining blocks 2 may be formed of a conductive material, such as aluminum. The retaining block 2 may be approximately 8 mm×4 mm×4 mm. A support member 5 may fix the retaining blocks 2 with respect to one another. The support member 5 may be formed from a material with near zero thermal expansion, such as a lithium aluminum silicon oxide glass ceramic rod. The retaining block 2 may include a sample conduit 8 for placing the sample into the retaining block 2. The sample conduit 8 may be machined into the retaining block 2 using a 500 μm electrical discharge hole-punch, for example. The retaining block 2 may include a sample region 13 where the region of interest of the sample is to be placed when affixing the sample within the fixture for testing and imaging. In order to keep the sample in place within the fixture, a sample constraint 12 may be provided in the retaining block 2 that is selectively insertable into the sample conduit 8. The sample constraint 12 could be a screw or any other known fastener. The sample constraint 12 may be formed from a conductive material, such as aluminum.

The support member 5 may be located within the retaining block 2. A support member conduit 1 may be provided in retaining block 2 for inserting the support member 5. Further, a support member constraint 4, such as a screw or any other known fastener, may couple the retaining blocks 2 to the support member 5. The retaining blocks 2 may be adjustable along the support member 5 by the selective insertion of the support member constraint 4 into the support member conduit 1.

The fixture may further include a fixture support 7 to support the fixture, particularly during XCT data acquisition and may include a fixture support constraint 6. The fixture support 7 may be sized such that it fits inside the support member conduit 1, the fixture support constraint 6 may, like the support member constraint 4, be selectively insertable into the support member conduit 1.

The retaining block 2 may include an electrical lead conduit 10 for connecting electrical leads to the retaining block 2 for performing electrical tests on the sample. The electrical lead conduit 10 may include an electrical lead constraint 9 (not visible in FIG. 1), similar to constraints 4, 6, and 12, that is selectively insertable into the electrical lead conduit 10 for holding the electrical lead in place. When the electrical lead is connected to the retaining block 2, the retaining block 2 may act as a conductor for electricity to travel to the sample. In another form, the retaining block 2 may include only the electrical lead constraint 9 for connecting the electric lead directly to the retaining block 2. In yet another form, the electrical lead conduit 10 may connect to the sample conduit 8 for directly connecting the electrical lead to the sample.

The fixture may include an auxiliary connection 3 on the retaining block 2 for connecting auxiliary testing equipment or a fixture support to the fixture. The auxiliary connection 3 may be a threaded connection to attach a side-mounting resistive ceramic heater, for example. The fixture may further include a vent 11 drilled into the retaining block 2 for venting gas, etc. The retaining block 2 may also include a connection terminal for either a positive or negative lead to a power supply. FIG. 2 shows several views of an example prototype of the assembled fixture, including the a) side, b) front, c) back, d) top, and e) perspective.

In operation, if the sample is mounted at ambient room temperature, and the electromigration testing is performed at elevated temperature, minimal thermal stress on the sample due to fixture expansion is desired. Although a brittle mechanical member, the strength of the support member 5 may be sufficient to couple the retaining blocks 2. The support member 5 may also be desirably characterized by a high degree of x-ray transparency, especially at high x-ray energies, since the support member 5 enters the field-of-view and affects the data acquired during XCT data acquisition.

The electromigration in situ fixture and system may possesses control over sample temperature and provide mechanical constraint in order to perform electromigration testing with sufficient control over lifetime influencing parameters. Thus, the fixture may be well suited for the application of cyclic heating-cooling conditions, which can give rise to thermal fatigue stresses which can also cause failure in real packages, and thus are also of interest. That is, the system may enable in situ imaging during the application of thermal fatigue.

Figure 3:
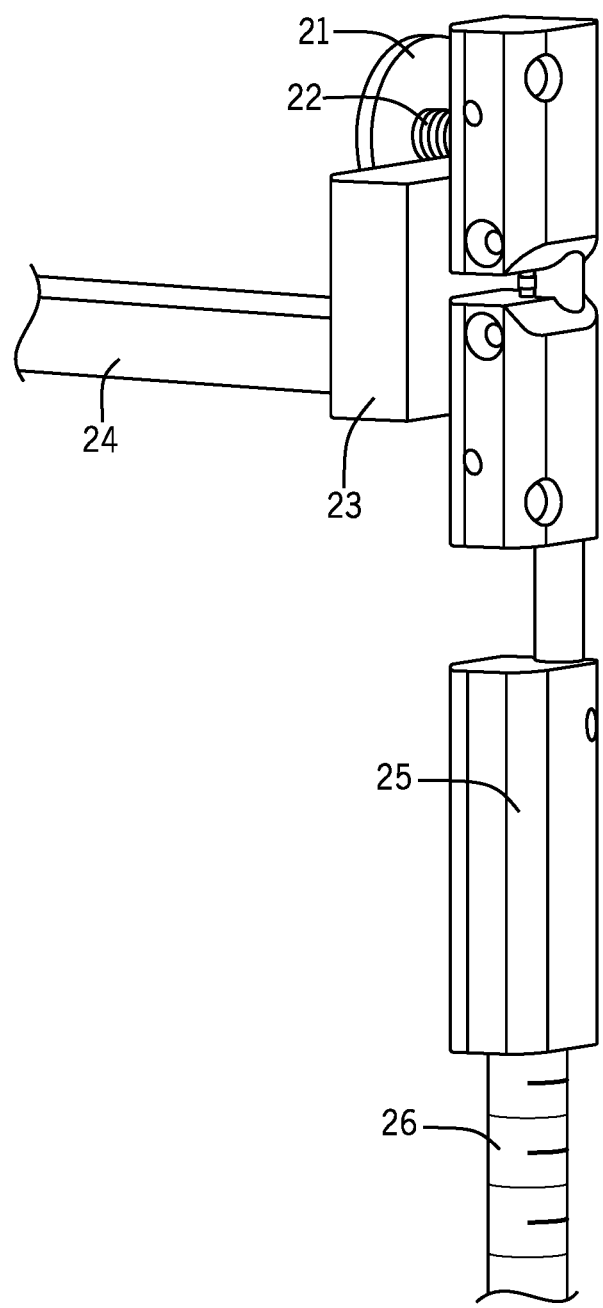
FIG. 3 shows an example system including a heater connected to a fixture for mounting a sample for in situ imaging during electrical and thermal testing.

Heating of the sample for thermal testing may be achieved through the use of a heater. As seen in FIG. 3, the system for in situ imaging during electrical and thermal testing of a sample may include the fixture for mounting the sample and a heater 23 for thermal testing. The system may include a heater mounting screw 22 and a heater stress washer 21 for holding the heater 23 up to the fixture. For example, the heater 23 may be a ceramic resistive heater capable of up to 200° C. for conductively heating the sample through the fixture and performing accelerated testing on the sample. To monitor the temperature in the sample during electromigration, a thermocouple may be fed through a thermocouple chamber near the sample. The heater 23 may include thermocouple and power supply lead wires 24 for monitoring the temperature and powering the heater 23. The high thermal conductivity of aluminum and copper may aid in the efficient transfer of heat from the heater 23 to the sample.

Figure 4A:
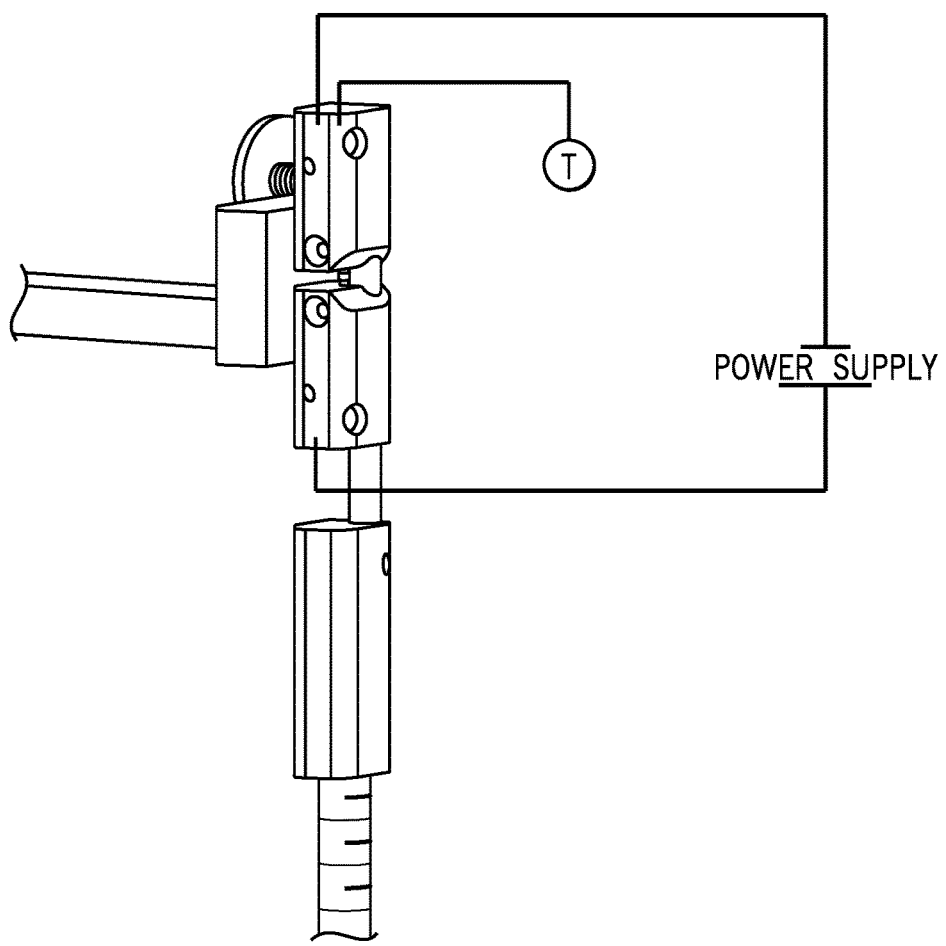
FIG. 4A shows another example of the in situ imaging system configured for sample electromigration testing including a fixture support, a thermocouple, a power supply, and a heater assembly.
Figure 4B:
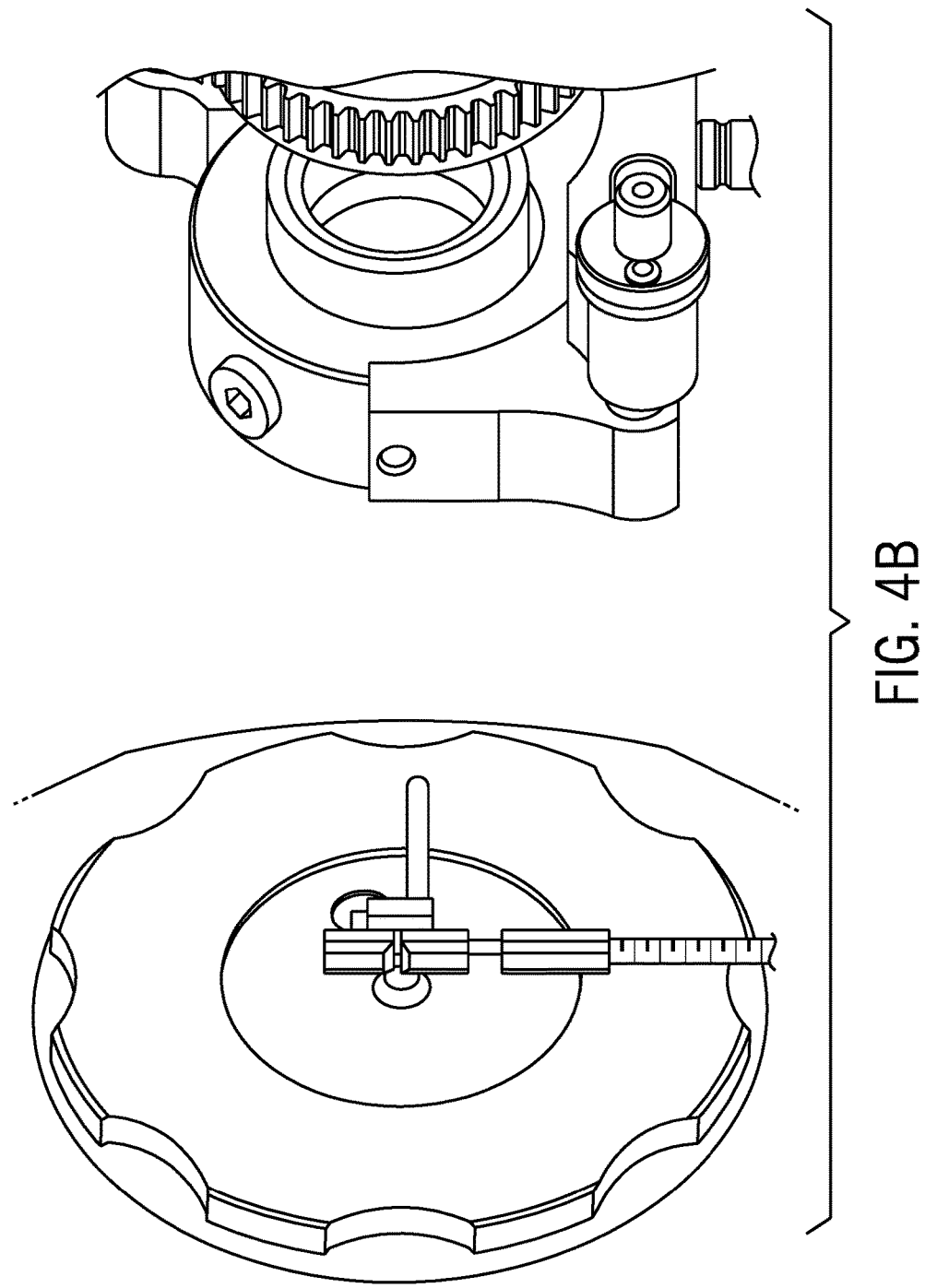
FIG. 4B shows another example of a system configured for sample electromigration testing including a fixture for holding the sample, a rotation stage, an x-ray source, and an x-ray detector.

FIG. 4A shows another example of a system for in situ imaging of a sample undergoing electromigration testing including a fixture support, a thermocouple, a power supply, and a heater assembly. The heater assembly may allow the system to perform accelerated thermal electromigration testing of samples. As mentioned previously, the thermocouple may allow the system to monitor the temperature of the heater, fixture, and sample. The inclusion of a power supply in the system may allow for the application of high current densities to the sample for electromigration testing. The fixture support or post 26 may help facilitate XCT imaging due to the multiple angles to which the sample may be required to be rotated. FIG. 4B shows another example of a system configured for sample electromigration testing including a fixture for holding the sample, a rotation stage, an x-ray source, and an x-ray detector.

As seen in FIGS. 4A and 4B, the system may include a rotation stage for XCT imaging. The system may include a post 26 leading to the XCT rotation stage. A schematic of the post 26 for mounting a sample within the fixture to the rotation stage of the XCT tomography system is also shown in FIG. 3. The rotation stage may be isolated from the electromigration circuit using an electrical isolater 25 to inhibit electrical shorting. The electric isolator 25 may be a polymeric post or isolating polytetrafluoroethylene (PTFE) block for electrically isolating the fixture.

Being a 3D technique, XCT imaging may have more geometric demands on the sample than other techniques, such as optical microscopy or electron microscopy. In order to perform XCT imaging, the heater plate may be removed from the fixture due to mechanical stresses on the fixture and undesirably high x-ray absorption. In some systems, for performing x-ray tomography scans, one of the electrical leads, the thermocouple leads, and the heater assembly may be removed before acquiring radiographic projections at a variety of orientations. To continue the electromigration process after XCT scanning, the electrical lead, thermocouple, and heater assembly may be reattached to the fixture. The small footprint of the fixture may provide a very large x-ray flux through the region of interest in the sample 13, as the flux is dictated by the nearness of the region of interest to the x-ray source.

The XCT imaging technique provides volumetric structural information complimentary to more traditional techniques of 2D surface optical microscopy (OM) and scanning electron microscopy (EM). Yet, typically, OM and SEM techniques may provide better spatial resolution and feature contrast for a single surface. This considered, another approach made possible with the disclosed system is to enable multimodal 2D surface characterization and in situ imaging during electromigration by creating a polished facet on the sample. This facet may have a depth of up to half of the diameter of the sample conduit 8. This facet may not be necessary for 3D XCT imaging. Once the sample has been inserted into the retaining blocks 2, the polished surface may be used for making contact with the sample constraint 12, providing a larger contact area and also inhibiting rotation inside the sample conduit 8.

Figure 5:
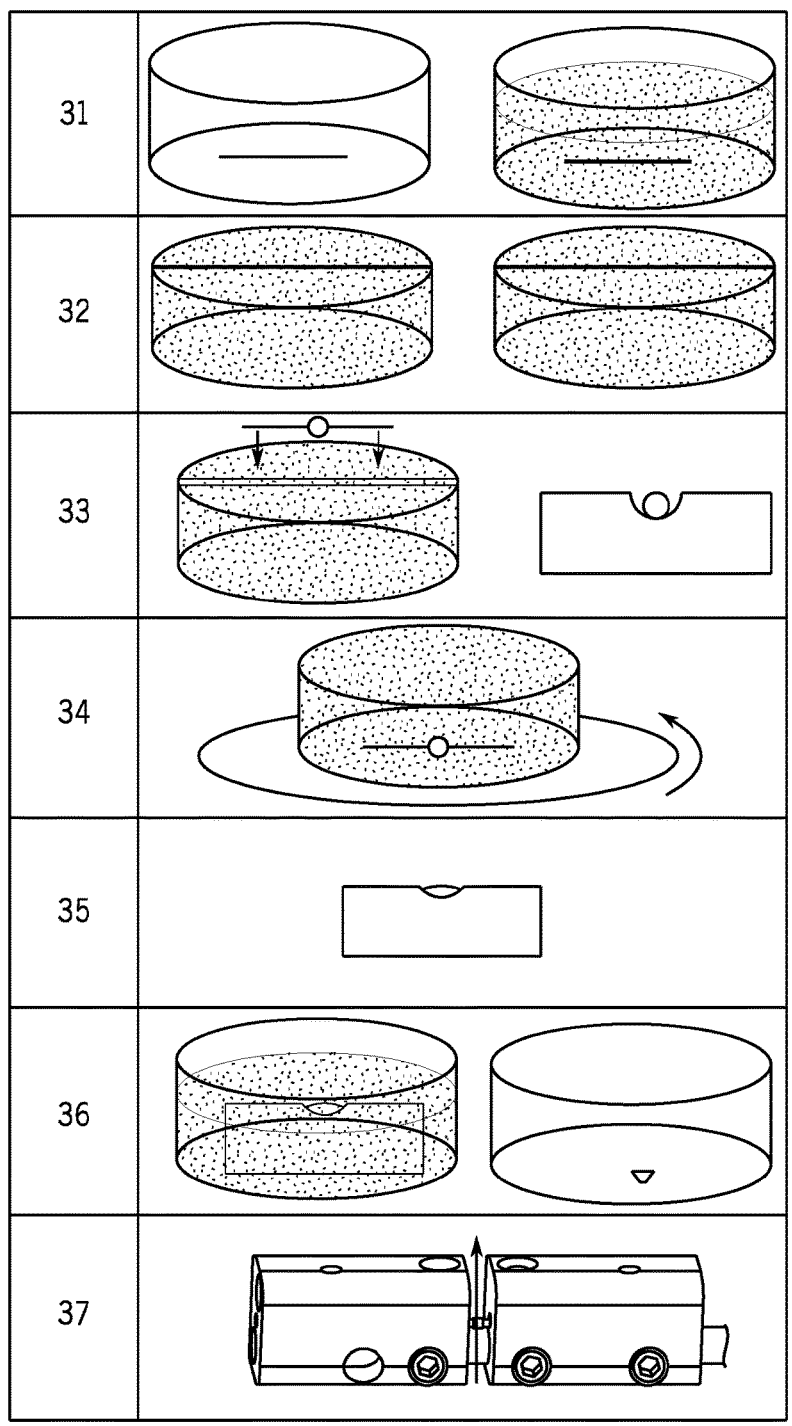
FIG. 5 shows a flow-chart illustrating an example method for preparing samples with a polished facet.

FIG. 5 shows an example process used for polishing a facet into a wire-like sample without any residual mounting or encapsulation, as is often used when creating a facet on a sample. This approach may be used for conducting OM, SEM, EBSD, and OIM imaging techniques, and may be extended to other surface characterization techniques. The process consisted of creating a molded sample mount (31-32), fixing the sample to a groove in the mount (33), polishing the sample in the mount (34-35), removing the sample from the mount (36), and mounting the free sample in the testing fixture (37). This process may be used to prepare samples with a polished facet free from surface encapsulation or mount, for example in the case of solder butt-joint samples on copper wire substrate. Step 31 shows that a straightened copper wire of approximately twice the sample size was treated with mold release placed in a mold and polishing lab-grade slow-set epoxy was poured into the mold and allowed to dry. Step 32 shows that half the thickness of the groove-forming, or molded, wire was ground away from the wire-containing face and the wire was removed. In step 33, the sample was super-glued into the resulting groove or recess in the epoxy puck (side view shown at right), and in 34, a facet was polished into the sample in that the desired thickness of the sample-containing face of the epoxy puck was ground away and polished. Step 35 shows the constrained and facetted sample as viewed from the side. Step 36 shows that the sample was freed from the epoxy puck by dissolving the bonding super glue with acetone and cleaned. Finally, step 37 shows that the facet-polished sample was loaded into the in situ electromigration fixture with the sample constraints engaging at the polished surface of the sample (polished surface normal vector shown by the black arrow).

Figure 6:
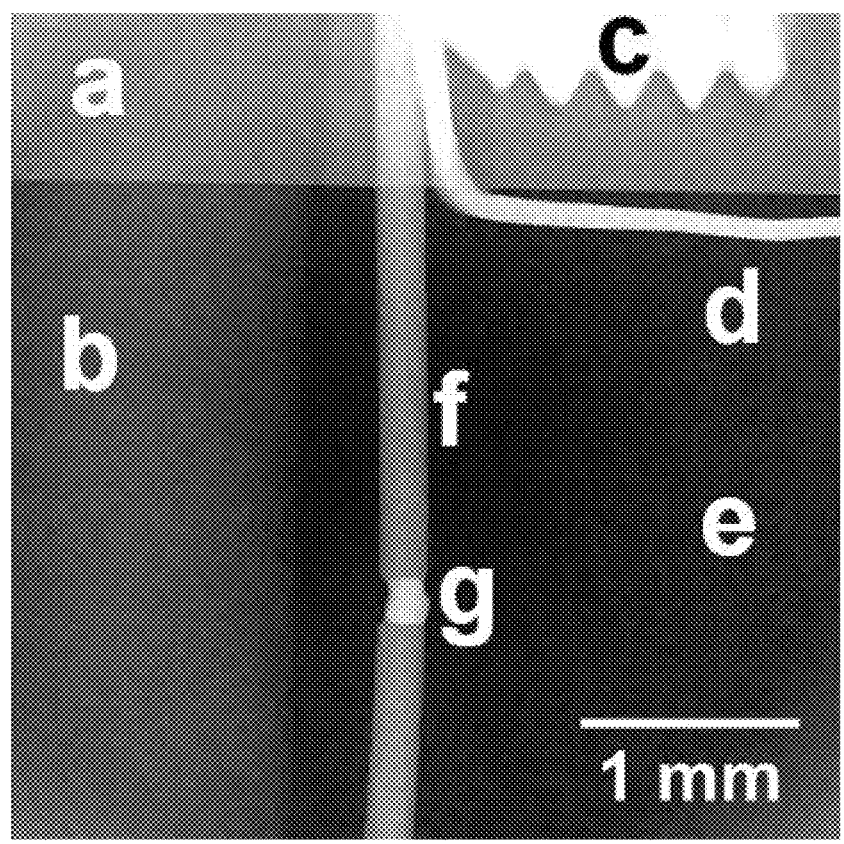
FIG. 6 shows a radiograph image of an example of the electromigration in situ testing fixture.

An example approach that may used for mounting the sample using the sample constraint is placement of a metallic ribbon into the sample conduit along with the wire-like samples, primarily to distribute the binding force but also to reduce sample susceptibility to shearing upon tightening of the sample constraint. FIG. 6 shows a radiograph image of the assembled fixture with a copper ribbon, with a copper ribbon washer (d) and copper wire solder substrates (f), used in mounting the wire-like sample, here, a solder butt-joint, into the fixture. The sample shown in this image is not faceted, but rather is fully encapsulated at the solder surface using epoxy. FIG. 6 also provides an example arrangement of the support member (b), the sample constraints (c) holding the sample to the retaining block (a) and the location of the sample constraints (c) with respect to the volume of interest of the sample (g) in the surrounding air (e).

FIGS. 7-16 show examples of data, characterization, and imaging scans acquired from various samples placed in the disclosed fixtures and systems taken in situ during different stages of thermal and electrical testing used for electromigration studies. The details of each of the figures are described below in the Example Experiments section. In combination, however, the figures reveal the versatility and advantages that the disclosed systems and fixtures provide. Because the fixture allows for substantially uninterrupted multimodal imaging techniques of the samples before, during, and after accelerated electromigration testing, more and better data can be gathered from the sample testing. This leads to more accurate and precise predictions about the microstructure evolution of wire-like samples in varying conditions. Thus, the system and fixture may enable in situ characterization of micro-scale samples under electrical current using a wide range of optical microscopy, electron microscopy, and x-ray imaging characterization techniques.

The present invention has been described in terms of one or more preferred embodiments, and it should be appreciated that many equivalents, alternatives, variations, and modifications, aside from those expressly stated, are possible and within the scope of the invention. Other possible alternatives, variations, and modifications of the present invention are shown in the accompanying embodiments.

Example Experiments

A demonstration of the system's successful electromigration testing and the compatibility of the fixture with the characterization tools outlined is provided in the following descriptions of the experiments. The experiments were directed to research on lead free solder microstructure induced failure. Specifically, electromigration testing (at an elevated temperature and high current density) was performed on solder butt joints, where the majority of the length of the sample was copper wire contact and the region of interest was the solder volume connecting the wire substrates on either side. Through these experiments, the design for the system and fixture was honed for the study of electromigration damage in single-sample solder volumes at an elevated temperature using in situ µXCT, optical microscopy techniques, and electron microscopy techniques. A system and fixture design was conceived for inducing and monitoring accelerated electromigration damage in individual solder volumes of a butt-joint geometry and for performing in situ 2D and 3D characterization of damage and microstructure evolution. It is emphasized that although the fixture was conceived for the study of butt-joint solder micro-volumes, it may similarly be used for other joint geometries (with modification) or for any wire-like sample (without modification). Most advantageously, the fixture design allows for both characterization and testing of a sample using the same fixture.

Both the provision of the mechanical support and the release of free-standing joints during testing allowed for in situ testing. These features also provided a means for destructive characterization after testing. Electromigration testing required the application of an electrical current through the sample. The fixture provided this capability through a conductive retaining block which facilitated electrical connection to the leads from a power supply. The retaining blocks were mechanically constrained to one another using a non-conductive support member to limit the flow of current to the test volume itself while simultaneously inhibiting undesired mechanical forces from acting on the test volume.

Accelerated electromigration required elevated test temperature conditions. The experimental fixture has several desirable characteristics from a thermal standpoint. The electrically conductive retaining blocks are also highly thermally conductive, which allows a conductive heater to be applied to the surface of the retaining blocks to achieve elevated temperature within the test volume. In this conductive heating configuration, a resistive heater was used, and temperature was controlled in the test volume through the applied power to the resistive heater. Convection heating was also used, by placing the test fixture within a convection furnace, but in this approach, the thermal conductivity of the fixture is less critical.

The high thermal conductivity of the retaining blocks allows them to act as efficient heat sinks. This is important because, as the sample experienced current stressing, Joule heating was expected to potentially occur within the joint. In electromigration, dissipation of Joule heating is sought to minimize deviations between the target and actual testing temperature to enable more accurate migration analysis and mechanistic insight.

The fixture was also designed to study microstructure evolution through thermal aging in the individual solder volumes (without necessarily applying a current). To monitor the test volume temperature during electromigration testing, which may deviate from the applied temperature due to Joule heating, the fixture was designed such that a thermocouple could be placed near the test volume within the fixture.

In the experiments, aluminum (2024 T351) is used for the retaining blocks due to its ideal combination of stiffness, strength, and electrical and thermal conductivity. The retaining blocks are arranged vertically along the support member so that the sample conduits in the retaining blocks are aligned with each other. The sample is placed into each retaining block through 500 μm EDM hole-punch machined sample conduits. The solder contacts, in this case the copper wire, are fixed to the aluminum retaining block using set screws nearest the sample on the retaining block.

A Zerodur® (SCHOTT North America, Inc.) glass rod 1.5 mm in diameter is used as the support member and similarly placed between the two aluminum retaining blocks, using a machined cylindrical support member conduit and set screw. The Zerodur® rod provides mechanical connection and support between the aluminum retaining blocks, but does not provide an electrical connection limiting current pathways between the aluminum retaining blocks to within the solder sample itself. The Zerodur® material is chosen for this rod because of its thermal and electrical properties, with a near zero thermal expansion coefficient ($0.05\pm0.10\times10^{-6}$/K from 20° C. to 300° C.) and near zero conductivity. Minimal thermal expansion was sought for the scenario in which a sample was mounted at room temperature and electromigration testing performed at an elevated temperature, as minimal thermal stress on the solder volume due to fixture expansion was desired. Each aluminum retaining block also had a electrical lead conduit for either the positive or negative lead to the power supply, secured to the block using a set screw. The bottom aluminum retaining block is also designed to facilitate a post to support the fixture, particularly during XCT data acquisition, and the top retaining block had a connection for a side-mounting plate heater.

The experimental retaining blocks also included a beveled edge, which is on the back side of the fixture shown in FIG. 1 (not visible). The purpose of the beveled edge near the sample volume of interest was to allow for a smaller gap between both retaining blocks when the fixture was fully configured for EBSD data acquisition, wherein the fully diffracted beam should not be obscured, which is discussed in more detail below.

As seen in FIG. 3, in one design configuration for true in situ testing, a ceramic resistive heater 23, being a 8 mm×8 mm square (Watlow Electric Manufacturing Company), was implemented to conductively heat the fixture up to 200° C. and ultimately the sample, mounted to the entire fixture using a set screw 22 and washer 21. The high thermal conductivity of aluminum and copper used in the fixture and sample aided in the efficient transfer of heat from the ceramic plate to the sample. The ceramic resistive heater configuration design was conceived for in situ OM, SEM, EBSD/OIM, and XCT characterization (although other techniques are may be compatible) during accelerated electromigration testing and thermal aging. Compatibility for measurement of the actual temperature at the sample has also been incorporated, which was of particular importance when Joule heating was expected, that is, if an electrical current was to be applied. To monitor the temperature of the sample during electromigration, a thermocouple contact was possible by feeding through the sample port. For performing XCT imaging, the heater plate was designed to be removable from the fixture after terminating any applied electric field, although this was not necessary for 2D characterization where sample rotation was not required for imaging. The set-up for XCT with the fixture is shown in FIG. 3. This rendition includes a design, which was conceived to eliminate electrical interaction with the grounded tomography equipment, using an intermediate PTFE block to isolate the testing fixture 25. For performing x-ray tomography scans, the design mandated that the upper power supply lead, the thermocouple leads, and the heater assembly be disconnected for stress-free rotation. To continue the electromigration process after XCT scanning with this design, the electrical lead, thermocouple, and heater assembly needed to be reattached to the fixture. During testing, the applied voltage, applied current, applied temperature, measured temperature, and calculated test resistance were recorded through a LabVIEW (National Instruments) user interface. The heater itself contained a feedback thermocouple in order to control the power to the heater and ultimately the temperature at the heater. Due to electrical shorting concerns, a rotation stage was isolated from the electromigration circuit using an isolating polytetrafluoroethylene (PTFE) block.

The major cross-sectional dimensions of the retaining blocks orthogonal to the sample axis were also minimized for the sake of XCT data acquisition, which also motivated implementing the 1 mm radii on the fixture. In XCT imaging leveraging a microfocus x-ray source, a smaller distance from the x-ray source target to the sample dictates the maximum x-ray flux achievable through the sample for a given x-ray tube voltage and power. In the design for minimized fixture size, #0-80 screws/threading were implemented wherever mechanical constraint was needed, including binding the glass rod, heater plate, fixture support post, electrical leads, and the sample. The 3 mm deep 1/16" diameter holes in the retaining blocks were such that lead wires of up to 16AWG could be used in electromigration testing with the fixture. The simple 1/16" through-all holes were placed for inserting the fixture's glass support rod between the retaining blocks. The glass cylinder acquired for testing had a diameter of 1.5 mm and a length of 10 mm. The prototype fixtures were fabricated by the CLAS Machine Shop at Arizona State University.

The process used for polishing a facet into a roughly 230 μm sample free of residual mounting is shown in FIG. 5. In general, the un-faceted sample may be adhered into a groove, polished, and then released by exposure to solvent. Once affixed to the jig, the sample may then be subjected to electromigration testing, thermal cycling testing, analyzed with μXCT, OM, SEM, diffraction techniques, such as electron-back-scattered-diffraction (EBSD) and any other suitable surface technique. More specifically, as shown in FIG. 5, a straightened copper wire of approximately twice the sample size may be treated with mold release and placed in a mold. Polishing lab-grade slow-set epoxy may be poured into the mold and allowed to dry. Half of the thickness of the molded wire may be ground away from the wire-containing face and the wire can be removed. The sample may be attached, for example using super-glue, to the resulting recess in the epoxy puck. The desired thickness of the sample-containing face of the epoxy puck may be ground away and polished, as shown in the side-view rendition of the constrained facet-polished sample in FIG. 5. The sample may be freed from the epoxy puck by dissolving the bonding super glue with acetone and cleaned. The facet-polished sample may then be loaded into the in situ electromigration μXCT jig with the sample constraints engaging at the polished surface of the sample (polished surface normal vector shown as a black arrow in (g)).

This fixture has been used to study individual solder volume response to thermally and electrically induced driving forces for failure at the solder level. To fabricate and control the reflow process of individual microscale solder joints, a silicon v-groove processing technique was implemented which has been described by previous researchers. A key aspect of the process is the use of a silicon v-groove assembly to make free-standing solder joints, that is, solder butt-joints which are not bonded to the silicon v-groove, where the v-groove is used primarily for butt-joint alignment and support during solder reflow. This approach has several benefits over a wafer-bonded solder joint [28-29], including but not limited to enabling mechanical testing of the solder joint and allowing for optimized XCT imaging via minimal surrounding material in place during attenuation-based x-ray imaging [25-26].

The experimental fixture's in situ functionality has been demonstrated on tin-based solder butt-joints during electromigration testing and thermal aging to perform multimodal characterization with OM, SEM, EBSD, OIM, and XCT. The solder joints have been fabricated by reflow of Sn-0.7Cu solder onto copper wire substrates in a silicon v-groove hot plate assembly which has been previously detailed. After reflow, the solder joints were then removed from the v-groove and mounted within the fixture after performing the faceting steps outlined in FIG. 5. The size of the solder volume investigated was controlled through the preform volume and the diameter of the copper wire substrate. The size of the solder volumes in the following proof-of-concept was approximately 230 μm in diameter before faceting. Two samples will be discussed, "Sample A" and "Sample B". Although the joints had a polished facet, they were entirely unconstrained at the solder surface. The free surface is believed to have affected the nature of the sample's evolution and failure that was observed.

The technique of μXCT provides complimentary 3D structural information to more traditional techniques of 2D surface optical microscopy (OM) and electron microscopy (EM). However, in most cases, OM and EM techniques can provide better spatial resolution and feature contrast for a single surface. This considered, another approach made possible with the invention is to enable multi modal in situ image, by machining a polished facet into the (roughly) cylindrical sample, with a depth of up to half of the cylindrical sample port's diameter. Once the sample has been inserted into the invention, the polished surface can be used for making contact with the set-screw, providing a larger contact area and also preventing rotation inside the sample chamber. The process used for polishing a facet into a roughly 230 μm sample without any residual mounting is provided in FIG. 5. Essentially, the un-faceted sample was adhered into a groove, polished, and then released by exposure to solvent. Once affixed to the jig, the sample may then be subjected to electromigration testing, thermal cycling testing, analyzed with μXCT, OM, SEM, diffraction techniques like electron-back-scattered-diffraction (EBSD) and almost any other surface technique.

In one example, the accelerated electromigration testing was performed at a current of approximately 1.51 A and an applied temperature of 100° C. before any Joule heating was observed. After about 220 hours of total testing time, the sample experienced total failure in the form of an open conductor circuit. At this point, the test structure was subjected to a 2D optical microscopy, 2D scanning electron microscopy, and 3D x-ray computed tomography microstructural characterization.

Figure 7:
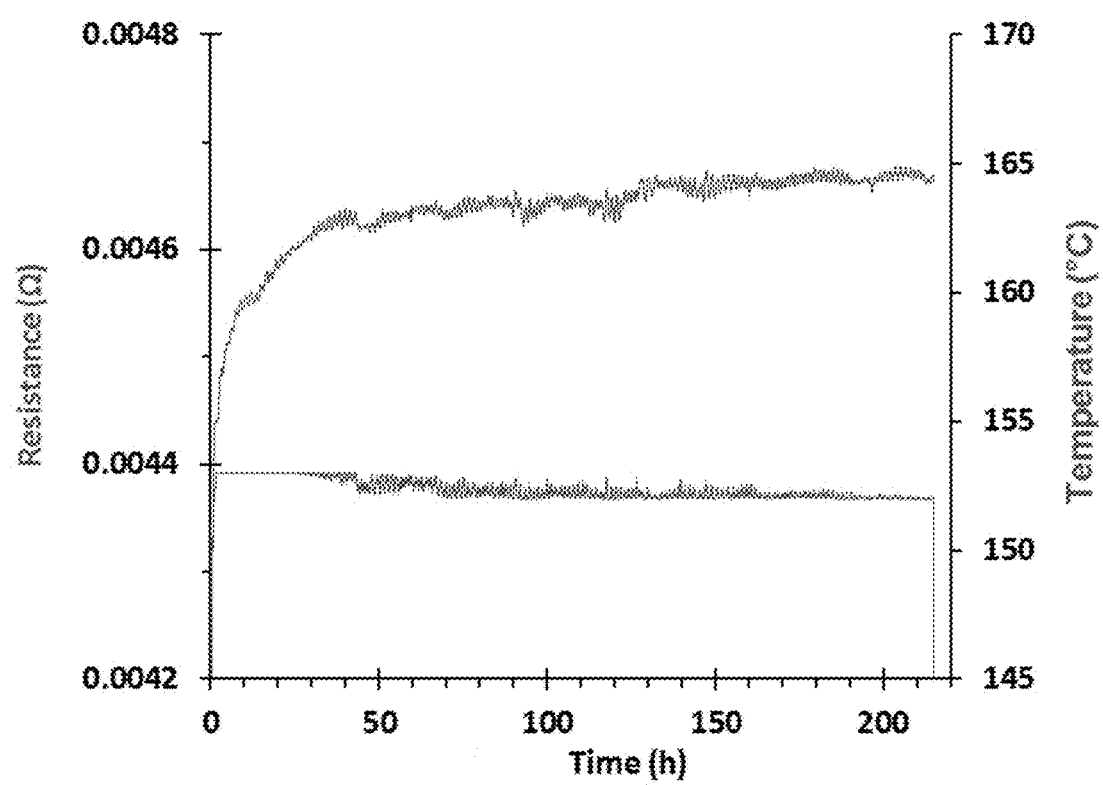
FIG. 7 shows an example resistance and temperature curve acquired during electromigration experiments using an experimental testing and characterization fixture.

A typical measured temperature and resistance plot during roughly 200 h electromigration testing of ~230 μm diameter Sn-0.7Cu solder on ~230 μm diameter copper substrates mounted in the fixture, and connected to the electrical power supply using 16AWG nickel-plated copper lead wires each of approximately 60 cm in length, is provided in FIG. 7.

Figure 8A:
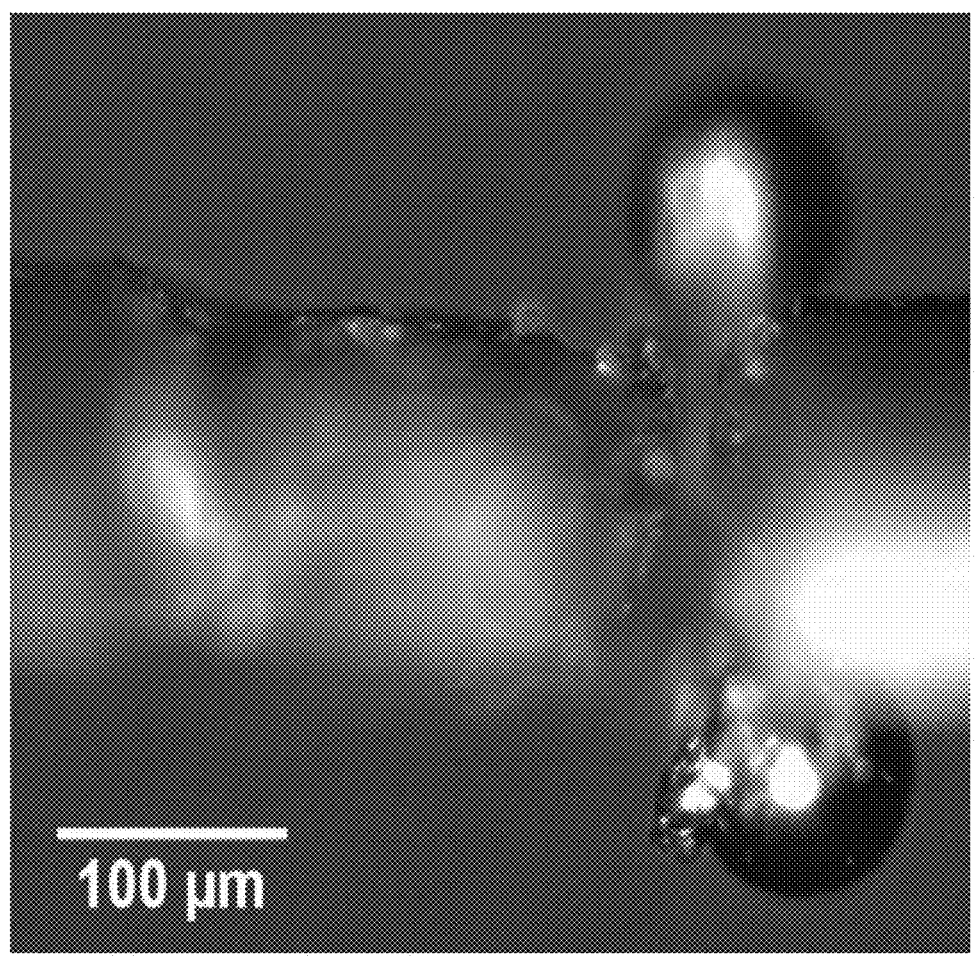
FIG. 8A shows an example of a bright field optical micrograph of a microstructure failure in a sample taken in situ within the electromigration fixture.

In some embodiments, even with leveraging three separate viewing orientations in OM, it may not be possible to acquire a clear picture of the actual 'fracture' surface, observable only partially, near the cathode. As shown in FIG. 8A, the failure-causing void formed as a result of electromigration obtained with OM is provided. The failed non-planar structures may be further studied using SEM, owing to a much larger depth of field. SEM may be applied in order to provide a clearer, fuller picture of the originally polished surface of the failed sample. Current and heat may be removed from the fixture to acquire the micrograph. The formation of solder nodules, protruding from the cathode interface, are shown both at the polished surface and the opposite side of the sample, where the prior is in focus, as shown in FIG. 8A. The micrograph may also provide better visualization of the failure surface near the cathode that could be acquired with OM.

As shown in FIG. 8A, accurately characterizing the failed solder volume in 2D my be challenging. The in situ fixture, including both the anode half and the cathode half of the failed sample, allows for reinvestigation of the solder volume using x-ray computed tomography. Hence, the sample was subjected to μXCT post-mortem, under the same scan conditions as the as-processed sample volume.

FIG. 8A shows a bright field optical micrograph of a failed prototype testing sample (side 1 view, not polished) after 220 hours of electromigration at $10^4$ A/cm$^2$ and 100° C., still contained within the electromigration fixture. Even with leveraging three separate viewing orientations in OM, it was not possible to acquire a clear picture of the actual 'fracture' surface, observable only partially, near the cathode. The most complete picture of the failure-causing void formed as a result of electromigration obtained with OM is provided in FIG. 8A. The failed non-planar structures were better studied using Scanning Electron Microscopy (SEM), owing to a much larger depth of field. Scanning Electron Microscopy (SEM) was applied in order to provide a clearer, fuller picture of the originally polished surface of the failed sample. Micrographs acquired using both Secondary Electron and Back Scattered Electron SEM contrast modes are provided in FIG. 11. The challenge of accurately characterizing the failed solder volume in 2D has been demonstrated (FIG. 8A).

Figure 8B:
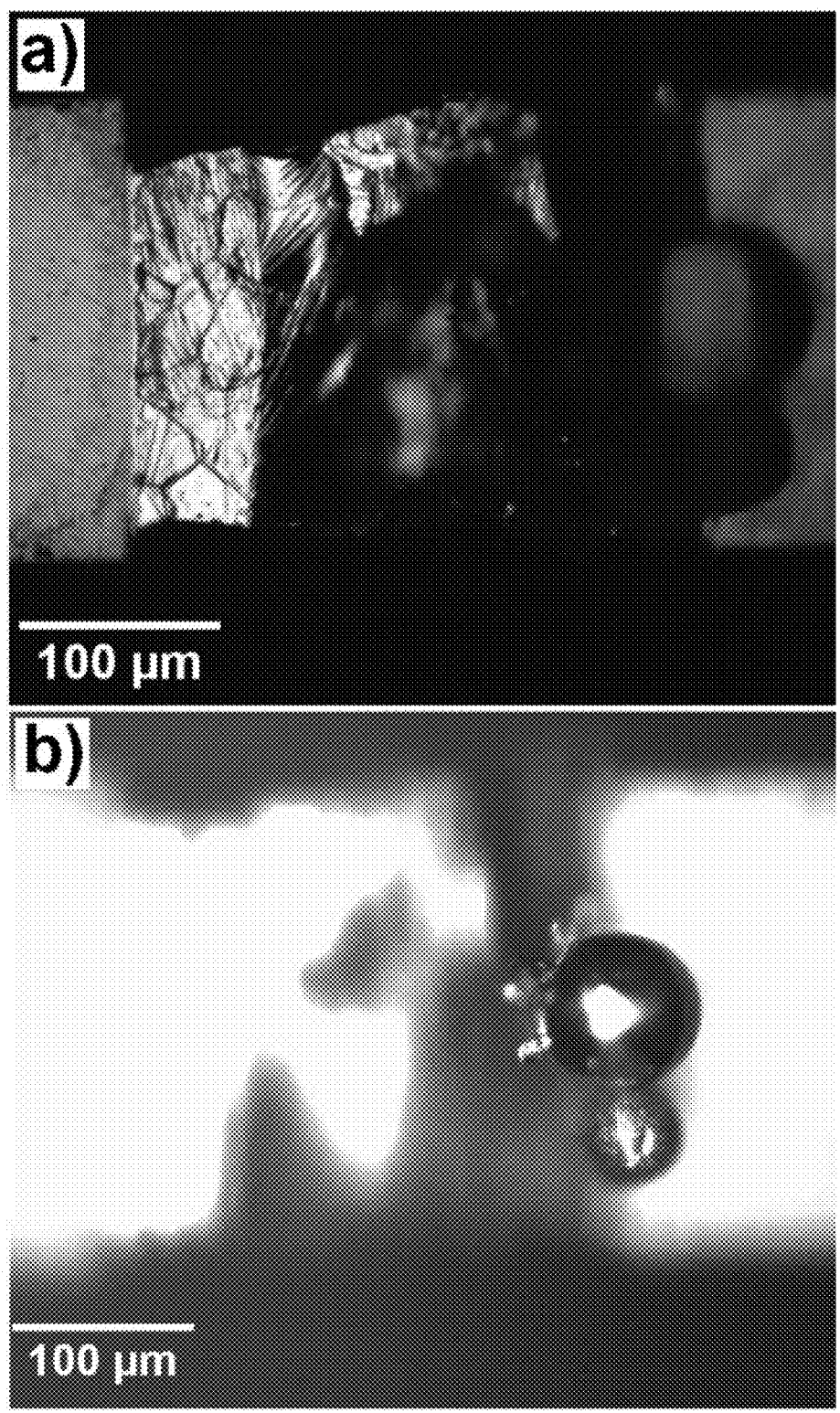
FIG. 8B shows two examples of optical micrographs of the microstructure of a sample taken in situ within the electromigration fixture.

FIG. 8B shows two optical micrographs of a failed "Sample A" after 220 hours of electromigration at $10^4$ A/cm$^2$ and 100° C., still contained within the electromigration fixture with the cathode at right and the anode at left at varying focus, a) growth structure in focus, b) anode in focus. As seen in FIG. 8B, after testing, due to the evolution of the solder joint, the polished surface has become rough and is not particularly well suited to optical imaging, although qualitatively the electromigration induced damage was observed. With the anode in focus, as seen in FIG. 8B (a), it can be seen that this interface is relatively unaffected by the electromigration failure, but that the cathode cannot be simultaneously observed due to growth structures that have formed at the cathode. Upon altering the focal plane as shown in FIG. 8B (b), the cathode can be seen to have changed dramatically at the surface. These observations are in agreement with what has been observed in XCT characterization of "Sample A" after failure.

A fully customized lab-scale XCT instrument utilizing a dual-target, cone-beam, microfocus x-ray source has been constructed for performing micrometer-scale imaging of material systems [30-32]. Volumetric time-resolved imaging of the copper-tin intermetallic phases within the solder and at the interface before and after electromigration was targeted in addition to electromigration induced voiding. Prior to conducting accelerated electromigration testing, x-ray computed tomography was performed on the as processed butt-joint "Sample A", mounted within an in situ electromigration fixture, in order to determine the minimum cross section of the solder conduction path. It was critical to measure the current bearing cross sectional area accurately, to determine the testing current density, which is questionably omitted from testing found in the literature. The current density targeted in this experiment was $1.0 \times 10^4$ A/cm$^2$. An XCT scan was performed by the custom lab-scale system. The CT scan was performed with the x-ray source at 82 kV and 5 W, that is, at a target current of 61 µA. Low energy x-ray filtering of the beam was performed using a 0.355 mm thick steel plate. The x-ray projections were acquired every ¼° over a 200° scan range (rather than 180° with the cone-beam angle considered), yielding 801 orientations for reconstruction. Projections were acquired in 1024$^2$ pixel format with the 2048$^2$ detector. The physical pixel size of the CCD was (15 µm)$^2$, but with 2×2-pixel binning during acquisition, a size of (30 µm)$^2$ was used. The optical magnification factor in the x-ray detector was 3.80×. An x-ray magnification of 16.7× was used with an x-ray target to rotation-axis distance of 8 mm and a target to scintillator distance of 134 mm. The resulting voxel size of the tomography data was approximately 0.5 µm, and the resulting maximum out-of-fan-plane angle used for XCT was 1.8°. The data was downsized by a factor of two to improve signal, reduce noise, and to bring the spatial sampling nearer the resolution of the x-ray source during the tomography scan. Finally, the resulting voxel size was roughly 1 µm resulting in close to 250 voxels across the polished edge of the copper wire cross section in the data volume used for analysis.

Reconstruction was performed using MATLAB (MathWorks) software computation. The reconstruction algorithm implemented was a modified version of open-source implementations of the FDK fast-Fourier-transform backprojection method made available by Rezvani et al. and alternately by K. Kim. The Shepp-Logan filter was used. Three orthogonal 2D views of the "Sample A" reconstruction volume are provided in FIG. 9. The gray values in the reconstruction volume represent the average x-ray attenuation for each voxel. More heavily attenuating phases are brighter in this rendering. The darkest phase is that of air or void, the medium gray phase is the copper volume, and the brightest phase is that of the solder volume.

Figure 9:
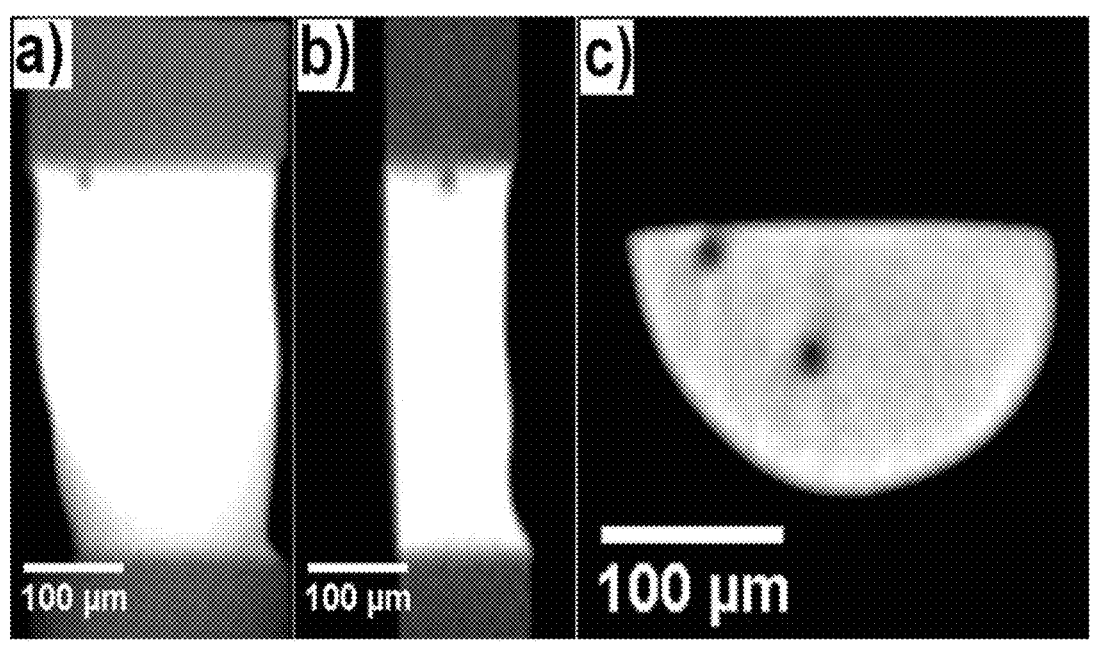
FIG. 9 shows three examples of orthogonal 2D views of the 3D reconstruction volume of a sample prior to accelerated testing taken in situ within the electromigration fixture.

FIG. 9 shows three orthogonal 2D views of the 3D reconstruction volume of the sectioned, free surface Sn-0.7Cu solder bonded to 230 µm diameter copper wires ("Sample A") prior to accelerated electromigration testing, a) Near the polished surface of the joint with rotation axis parallel to vertical direction, b) Orthogonal to the polished surface with the rotation axis parallel to the vertical direction, and c) A reconstruction plane orthogonal to the rotation axis and near the solder-copper interface portraying interfacial porosity; OLD FIG. 6 illustrates three 2D orthogonal views of the 3D reconstruction volume of the sectioned, free surface Sn-0.7Cu solder bonded to 230 µm diameter copper wires prior to accelerated electromigration testing. The volume was segmented for calculating the minimum cross section of the solder conductor. In the pre-electromigration volume, no intermetallic phase was observed. The gray value differences between copper and solder made the segmentation feasible with simple thresholding. The cross section was measured, and to reach 1.0·10$^4$ A/cm2, a 1.51 A current was applied as a constant current. Accelerated electromigration testing was performed with the top copper conductor shown in FIG. 9 acting as the cathode and with 100° C. applied. The effects of the un-encapsulated, free solder surface were expected to have ramifications on the observed solder joint lifetime and damage mode during testing. However, the sample could also have been encapsulated in underfill if desired. Failure was reached at approximately 220 hours of testing. At the end of the test an observed Joule heating of +35° C. from the applied temperature was observed, similar to what has been previously reported elsewhere, and the current density was expected to be greater than $1.0 \times 10^4$ A/cm$^2$ after damage but before forming the open circuit failure that was witnessed.

The failed sample was studied with the XCT under the same parameters as the pre-electromigration volume. X-ray computed tomography applied post-mortem provided a clear description of the failed joint's structure. In order to quantify the migration of tin, copper, and the formation of intermetallic reaction products, it was necessary to segment to post-electromigration reconstruction volume into the phases of best description, according to gray value. It was found that using the 3D anisotropic diffusion filter was extremely beneficial in enhancing the uniformity of the gray value within the intermetallic phase of the reconstruction. Two slices from the processed volume are presented in FIG. 10 under two display settings for each. The void coalescence is seen near the cathode in FIGS. 10 (*a*) and (*b*) along with the formation of solder structures near the surface. The anode and cathode were completely separated but held in place from the top and bottom respectively by sample retaining blocks of the testing fixture. Although no copper-tin reaction product was observed in the pre-electromigration XCT volume away from the interface, the reaction products that formed as a result of accelerated electromigration in the post-electromigration volume were clearly observed. The presence of copper-tin reaction products within the failed solder joint in not obvious in FIGS. 10 (*a*) and (*b*), with the portrayed brightness and contrast settings, due to the relatively low difference in gray value between the intermetallic and the solder in the reconstruction. The black phase present in FIGS. 10 (*c*) and (*d*) corresponds to the surrounding air as well as the copper substrates, the bright phase corresponds to tin-rich phases, and the dark gray values correspond to the copper-tin intermetallic. A simple description of the intermetallic phase observed in the volume was that of a large, connected structure branching from the anode interface to a large central island via a narrow channel. The large central island is seen in FIGS. 10 (*c*) and (*d*) portrays a section containing growths down to the anode.

Figure 10:
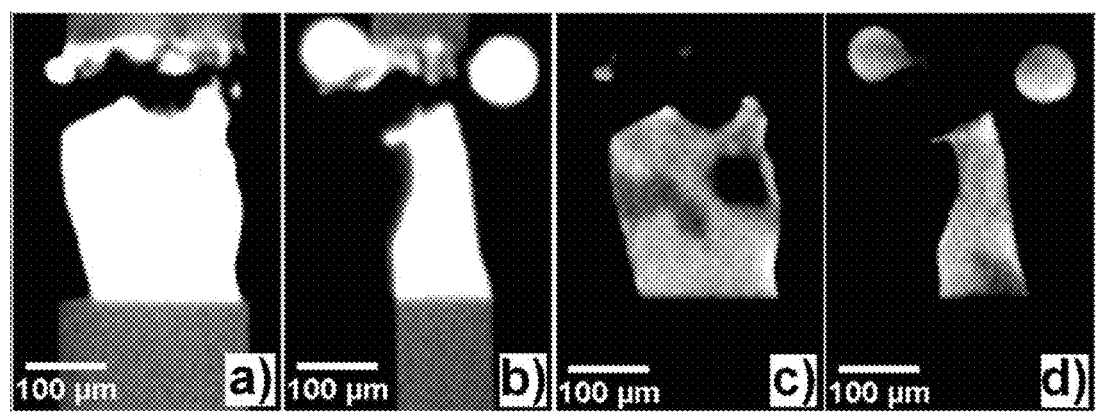
FIG. 10 shows four examples of 2D orthogonal virtual cross-sectional views of the 3D reconstruction volume of a sample after accelerated testing taken in situ within the electromigration fixture.

The tomography result is shown in FIG. 10, where three orthogonal cross sections (i.e., near the originally polished surface of the sample with rotation axis parallel to vertical direction and cathode at top, where the copper migrated away from the cathode interface, orthogonal to the polished surface with the rotation axis parallel to the vertical direction and cathode at top, and a reconstruction plane orthogonal to the rotation axis and near the cathode solder-copper interface portraying observed migration spheroid structures, respectively) are provided. The brightness and contrast settings for visualizing the tomography data may be adjusted for best contrast of the copper, solder, and surrounding air. The brightest portions indicate solder, the medium gray indicates copper, and the black portions correspond to the surrounding air.

The fixture may further provide the ability to explore the failed solder sample, which exhibited a complex 3D evolution from the original as-processed sample structure. As shown in FIG. 10, the virtual 2D sections of the sample volume provide a more clear description of the failure surface than was possible with OM or SEM imaging methods. Therefore, the design consideration for application of the systems and methods toward x-ray computed tomography include the minimized footprint and x-ray transparency.

The invention provides unrivaled ability to explore the failed solder sample, which exhibited a complex 3D evolution from the original as-processed sample structure. As seen in FIG. 10, the virtual 2D sections of the sample volume provide a much clearer description of the failure surface than was possible with OM or SEM imaging methods. Therefore, the design consideration for application of the invention toward x-ray computed tomography were most critical, including the minimized footprint and x-ray transparency.

FIG. 10 shows two 2D orthogonal virtual cross section views of the 3D reconstruction volume of the failed free surface Sn-0.7Cu solder butt joint on 230 μm diameter copper wires after accelerated electromigration testing, portraying the failure surface and the growth structures with a) the brightness and contrast adjusted for solder/copper contrast where the brightest phase is the solder joint, the medium phase is the copper wire substrates, and the black phase is the surrounding air, b) the same as (a) but on a perpendicular section, and with c) the brightness and contrast adjusted for solder/intermetallic contrast, where the black phases are copper and air, the dark phase is the intermetallic, and the lightest phase is the tin rich solder, and for d) the same as (c) but on the same perpendicular section as (b). The in situ fixture, containing both the anode half and the cathode half of the failed sample, allows for reinvestigation of the solder volume using x-ray computed tomography. Hence, the sample was subjected to μXCT postmortem, under the same scan conditions as the as-processed sample volume. The tomography result is provided in FIG. 10, where three orthogonal cross sections are provided. The brightness and contrast settings for visualizing the tomography data have been adjusted for best contrast of the copper, solder, and surrounding air. The brightest portions indicate solder, the medium gray indicates copper, and the black portions correspond to the surrounding air.

Figure 11:
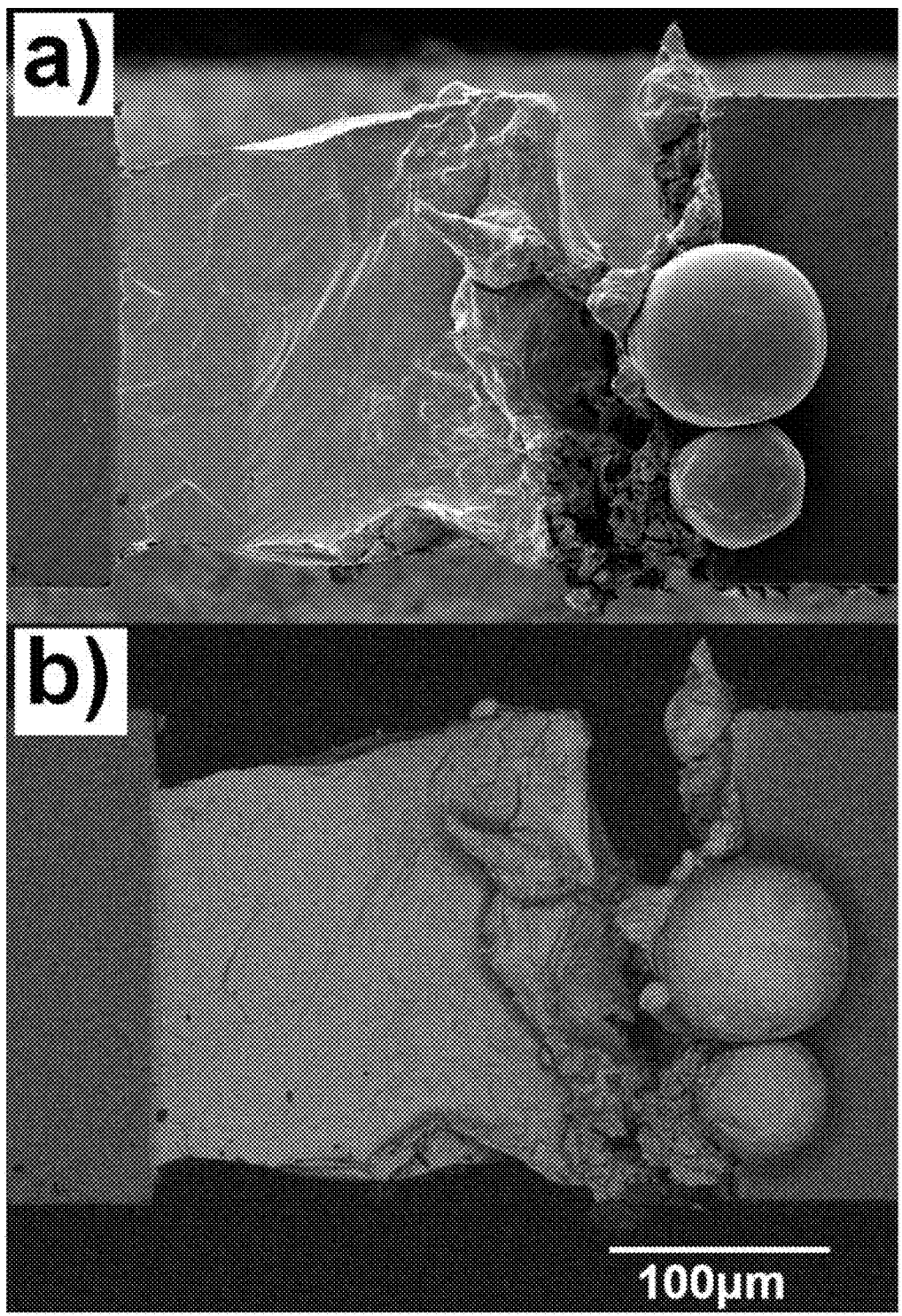
FIG. 11 shows two examples of scanning electron micrographs of a sample after accelerated testing taken in situ within the electromigration fixture.

FIG. 11 shows two scanning electron micrographs of the failed "Sample A" after 220 hours of electromigration at $10^4$ A/cm$^2$ and 100° C., still contained within the electromigration fixture with the cathode at right and the anode at left under varying contrast modes, a) SE contrast, b) BSE contrast. Micrographs acquired using both Secondary Electron and Back Scattered Electron SEM contrast modes are shown in FIG. 11. Electrical current and heat may be removed from the fixture to acquire the micrograph. As shown in FIG. 11, the cathode is at the right and the anode is at the left. The coexistence of both failure causing void formation and migrated solder at the cathode interface is more clear with SEM. After failure, "Sample A" was again subjected to SEM imaging as seen in FIG. 11. The primary benefit of SEM as applied to "Sample A" after failure is the greater depth of field than was obtained in OM, allowing the very rough originally faceted surface to be in focus with a single image. Observable in the right portion of FIG. 11, at the cathode, is the failure void, though partially obscured by the growth structures. Micrographs acquired using both Secondary Electron (SE) and Back Scattered Electron (BSE) SEM contrast modes are provided in FIG. 11.

Figure 12:
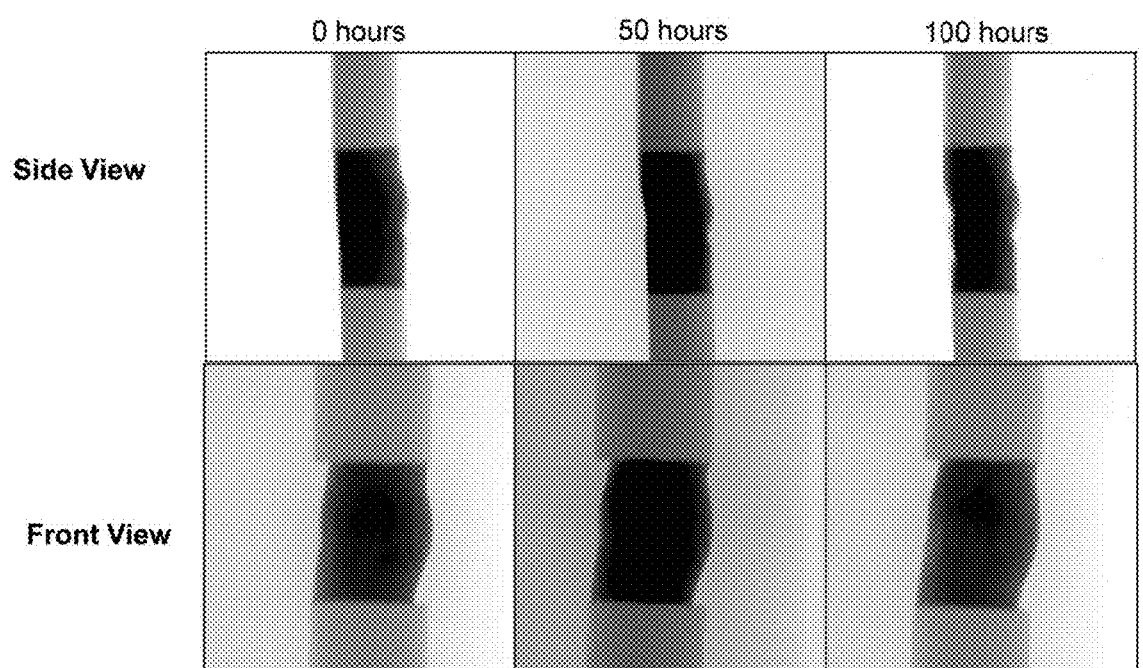
FIG. 12 shows examples of orthogonal x-ray projections from tomography data acquisition taken in situ during accelerated testing of a sample within the electromigration fixture.

FIG. 12 shows orthogonal x-ray projections from tomography data acquisition during accelerated in situ electromigration testing of sample prototype test sample at $10^4$ A/cm$^2$ and 100° C. In situ x-ray images are provided of the sample at various time steps throughout the testing in order to demonstrate the in situ capability under a wide range of characterization techniques enabled by the fixture. As can be observed in the projections of the sample in FIG. 10, some early migration of solder can be seen through the thinnest portion of the conductor. In the side view projections of FIG. 12, a normalization of the solder cross section is shown, where the solder migrated from areas of high conductor cross section, and migrated less at regions of thinner cross section. The example sample shown in FIG. 12 has experienced up to 100 hours of testing and is being imaged with interrupted μXCT with a 50 hour time step.

Figure 13:
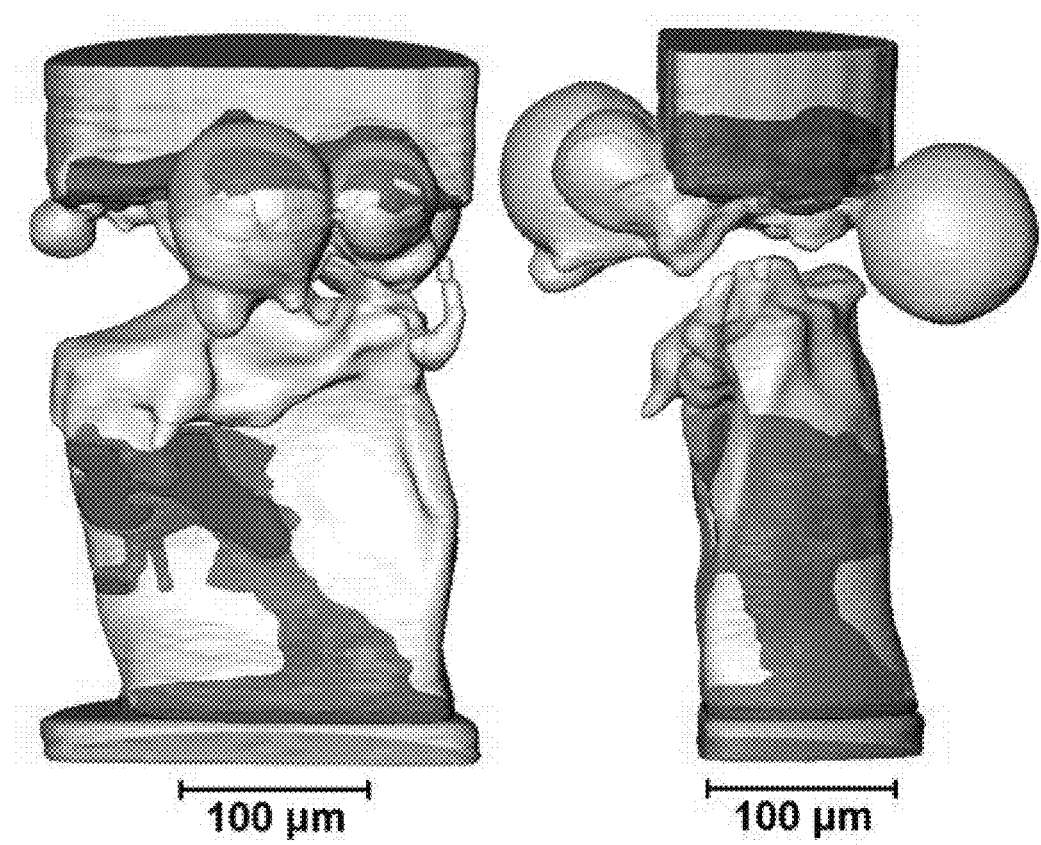
FIG. 13 shows an example of a smoothed surface rendering of an XCT volume of a sample after accelerated testing taken in situ within the electromigration fixture.

FIG. 13 shows a smoothed surface rendering of the post-electromigration segmentation of the XCT volume, showing copper (orange transparent), tin-rich solder (gray transparent), and intermetallic (blue). The post-electromigration volume was segmented into copper, tin-rich, intermetallic, surrounding air, and void using a combination of grayscale noise filtering, global threshold, local threshold, 2D region grow, and 3D region grow algorithms. Global threshold was used to capture the tin-rich solder volume, including the low-contrast intermetallics. The copper phase was then captured using a solder-restrictive global threshold. No porosity was detected after failure. The copper-tin intermetallic was then captured using consecutive and cumulative 2D and 3D region grow implementations across all three planes and within the volume, however, this was performed using a gray volume which had first been filtered using 3D anisotropic diffusion which had been observed to give the best results with high-level knowledge of the structure. In order to observe the structure in 3D, the solder is shown as semi-transparent as is shown in FIG. 13. Here, the anode intermetallic is seen as connected in a continuous structure with the large central island of intermetallic that has formed in the joint.

Figure 14:
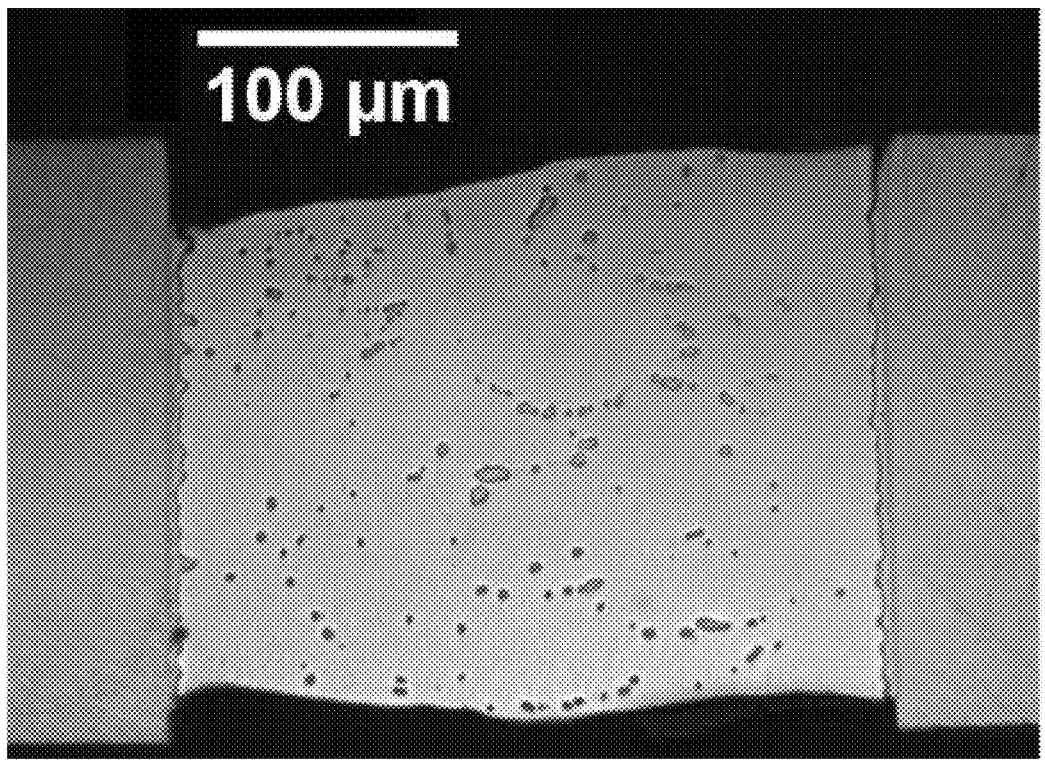
FIG. 14 shows an example of an optical micrograph of a sample after faceting and mounting within the electromigration fixture.

FIG. 14 shows an optical micrograph of "Sample A" after faceting and mounting within the electromigration fixture, displaying copper wire substrates, tin-rich solder, and intermetallic compounds at the interface and in the solder interior. Prior to and after conducting accelerated electromigration testing, OM was conducted on "Sample A" butt-joint mounted within the in situ electromigration fixture to compare results with that of other imaging modes. As seen in FIG. 14, before testing, the polished surface reveals the copper substrates, the solder phase, and intermetallic both within the solder interior and at the substrate interface.

Figure 15:
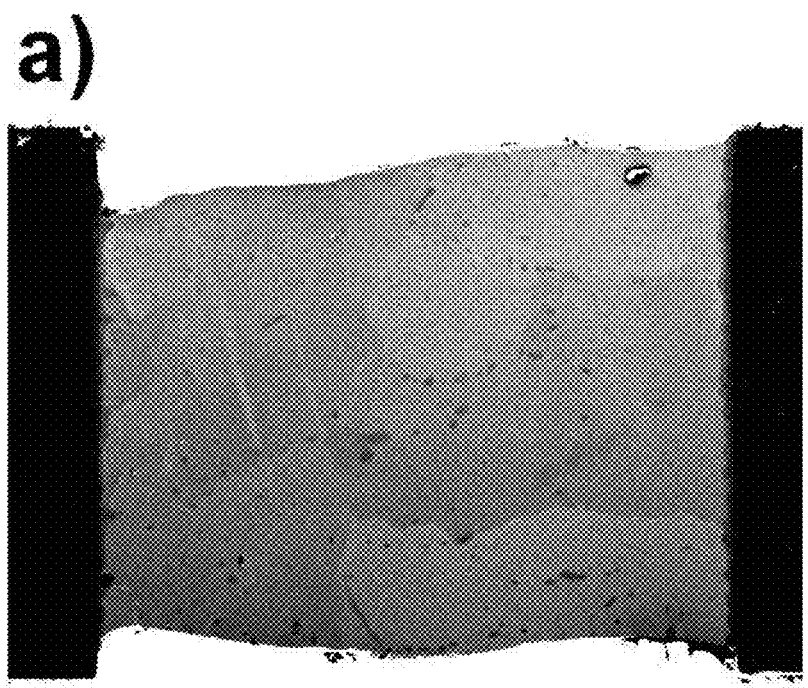
FIG. 15 shows two examples of scanning electron micrographs of a sample after faceting and mounting within the electromigration fixture.
Figure 15:
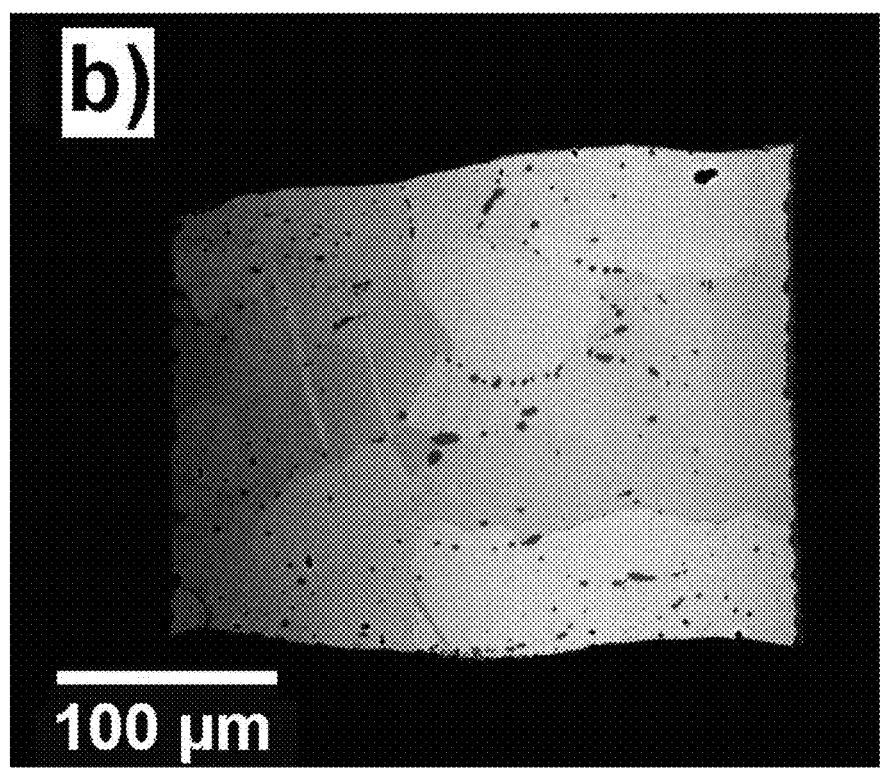

FIG. 15 shows two scanning electron micrographs of "Sample A" after faceting and mounting within the electromigration fixture, displaying copper wire substrates, tin-rich solder, and intermetallic compounds at the interface and in the solder interior under varying contrast modes, a) SE contrast, b) BSE contrast. The solder volume "Sample A" was also studied using SEM before and after failure. Scanning Electron Microscopy (SEM) was used to image the faceted surface of the failed joint. As seen in FIG. 15, before electromigration testing, similar results to optical microscopy are obtained, showing copper substrates, a tin-rich solder phase, and intermetallic compound. SEM imaging results before electromigration testing also provided observation of the grain structures qualitatively. Micrographs acquired using both Secondary Electron (SE) and Back Scattered Electron (BSE) SEM contrast modes are shown in FIG. 15.

Figure 16:
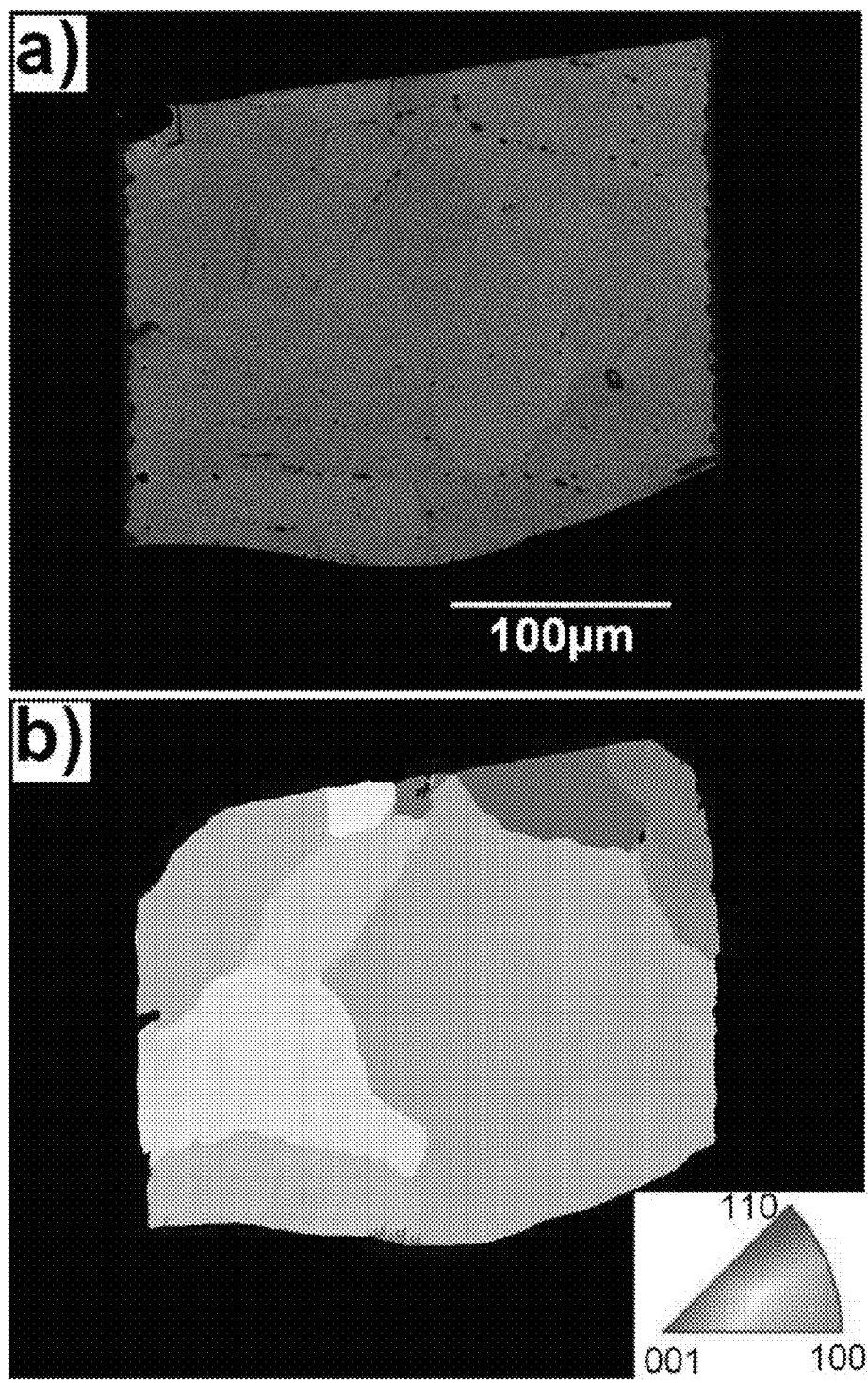
FIG. 16 shows an example of a scanning electron micrograph and an electron back-scatter diffraction derived orientation image map of a sample prior to accelerated testing taken in situ within the electromigration fixture.

FIG. 16 portrays a solder sample mounted within the in situ fixture prior to conducting accelerated electromigration testing, as observed with various imaging modes. OM and SEM images of a particular Sn-0.7Cu sample on ~230 μm diameter copper wire. The invention enables crystallographic characterization. In situ Electron Back Scattered Diffraction (EBSD) Orientation Image Mapping (OIM) was performed during accelerated electromigration testing, which are other characterization methods enabled with electron microscopy. X-ray computed tomography scans were also performed using a μXCT scanner. Three 2D orthogonal views of the solder sample volume are provided in FIG. 9. As shown in FIG. 16, a sample is mounted within the in situ fixture prior to conducting accelerated electromigration testing, as observed with various imaging modes. OM and SEM images of a particular Sn-0.7Cu sample on ~230 μm diameter copper wire having a crystallographic characterization. In situ Electron Back Scattered Diffraction (EBSD) Orientation Image Mapping (OIM) may be performed during accelerated electromigration testing, which are other characterization methods enabled with electron microscopy. X-ray computed tomography scans may also be performed using a μXCT scanner. More specifically, a bright field optical microscopy, a back-scattered electron contrast SEM, and an OIM Image and pole figure are shown in FIG. 16. Three corresponding 2D orthogonal views (i.e., near the polished surface of the sample with rotation axis parallel to vertical direction, orthogonal to the polished surface with the rotation axis parallel to the vertical direction, and a reconstruction plane orthogonal to the rotation axis and near the solder-copper interface portraying interfacial porosity, respectively) of the solder sample volume are provided in FIG. 9.

FIG. 16 shows "Sample B" within the electromigration fixture in the as-processed condition prior to electromigration testing as seen in through a) SEM imaging in BSE mode, and b) an Electron Back-Scatter Diffraction derived Orientation Image Map. To demonstrate the capability of the in situ fixture to also perform crystallographic analysis of contained volumes, another faceted Sn-0.7Cu solder joint, "Sample B", also approximately 230 μm in diameter before faceting, was introduced. This sample was processed identically to "Sample A". Although electromigration analysis of "Sample B" is still pending, it can be seen from FIG. 16 that the fixture was also conducive to grain structure analysis of a polished sample surface through EBSD/OIM. An EBSD scan was performed over the entire cross-section with a step size of 3 μm and the OIM results in FIG. 16 (b) demonstrate that the sample processing routine implemented results in a roughly equiaxed polycrystalline grain structure, as was suggested by SEM imaging of the same joint (FIG. 16 (a)) and an identically processed "Sample A" (FIG. 16). In order to perform EBSD on the samples loaded within the fixture, it was found that the gap between the aluminum retaining blocks needed to be 4 mm plus the length of interest along the axis of the wire-like samples when the beveled edge on the sample retaining block was incorporated.

Thus, the invention has enabled in situ characterization of micro-scale samples under electrical current using a wide range of optical microscopy, electron microscopy, and x-ray imaging characterization techniques.

The design of a new, miniature fixture for applying a voltage at elevated temperature to mechanically constrained individual microscale, wire-like samples has enabled analysis of stimulus induced microstructure evolution and damage evolution through an obtained multi-modal, in situ characterization and imaging capability. The fixture has enabled in situ characterization capabilities in a range of 2D techniques and a non-destructive 3D technique through a novel design which has achieved several critical performance traits, and the design solution for this purpose has been detailed. The functionality of the fixture has been demonstrated on a Sn-0.7Cu microscale butt-joint on a copper substrate subjected to accelerated electromigration. The suitability of the fixture for various surface imaging modes has been accomplished with a sample processing routine which has been provided in detail. The fixture has demonstrated suitability toward the observation of damage and microstructure evolution volumetrically using lab-scale XCT owing to a high transparency of the support rod material relative to the metallic materials that were tested.

Crystallographic analysis by OIM of the sample grain structure through EBSD has also been demonstrated, and with the application of electromigration or thermal testing, the fixture enables a temporally resolved understanding of crystallographic evolution. Although the fixture's functionality has been demonstrated on a particular solder composition on a particular substrate composition with a particular geometry, the approach may be extended to other solder systems, substrate and interface materials, and solder joint geometries as well as entirely different materials in which electromigration and/or thermal evolution is of interest and concern. It is expected that the fixture design and the demonstration put forth in this work will provide other researchers in same or similar fields with the necessary tools for performing time-resolved characterization of structural response to electrical and thermal stimulus using various imaging modes which may provide the complementary understanding needed to solve complex problems in advanced materials. The analysis which this testing fixture enables is expected to benefit the microelectronics and packaging community by furthering their ability to deconvolute complex failure mechanisms and to provide a new approach to extract enhanced understandings of fundamental material behaviors within electrical components wherein a reliability concern exists.

What is claimed is:

1. A fixture for mounting a sample for in situ imaging during electrical and thermal testing, comprising:
   a first retaining block having formed therein an first sample conduit extending from a top surface of the first retaining block to a bottom surface of the first retaining block along a first conduit axis;
   a second retaining block having formed therein a second sample conduit extending from a top surface of the second retaining block to a bottom surface of the second retaining block along a second conduit axis that is aligned with the first conduit axis;
   a first conductive constraint selectively insertable in the first retaining block perpendicular to the first conduit axis to constrain the sample extending through the first sample conduit;
   a second conductive constraint selectively insertable in the second retaining block perpendicular to the second conduit axis to constrain the sample extending through the second sample conduit; and
   a dielectric support coupling the first retaining block to the second retaining block, the dielectric support extending at least from the bottom surface of the first retaining block to the top surface of the second retaining block to define a sample region therebetween;
   wherein the bottom surface of the first retaining block faces the top surface of the second retaining block across the sample region, and
   wherein the sample region is dimensioned to provide in situ imaging of the sample extending into the first sample conduit into the sample region and into the second sample conduit.

2. The fixture of claim 1, wherein at least one of the first and second retaining blocks includes an auxiliary mounting.

3. The fixture of claim 1, further comprising a heater for heating the sample to a predetermined temperature during accelerated electromigration testing, wherein the heater is coupled to the auxiliary mounting.

4. The fixture of claim 3, wherein the dielectric support member is formed of a material having a substantially zero thermal expansion coefficient up to the predetermined temperature.

5. The fixture of claim 1, wherein the dielectric support member is formed of a lithium aluminum silicon oxide glass ceramic.

6. The fixture of claim 1, wherein the first and second retaining blocks are formed from a conductive material.

7. The fixture of claim 6, wherein the first and second retaining blocks are formed from aluminum.

8. The fixture of claim 1, wherein at least one of the first and second retaining blocks includes an electrical lead conduit extending from the top surface of the retaining block to the bottom surface of the retaining block along an electrical lead conduit axis.

9. The fixture of claim 8, wherein at least one of the first and second retaining blocks includes an electrical lead constraint selectively insertable into the electrical lead conduit.

10. The fixture of claim 1, wherein the first retaining block further comprises a first beveled edge extending from the top surface to the bottom surface of the first retaining block, and the second retaining block further comprises a second beveled edge extending from the top surface to the bottom surface of the second retaining block.

11. The fixture of claim 10, wherein a distance between the sample region and at least one of the first beveled edge or the second beveled edge for electron back-scatter diffraction is at least 4 mm.

12. A system for in situ imaging of microstructures of a sample during electromigration testing, the system comprising:
   a fixture for mounting the sample, the fixture comprising:
      a first retaining block having formed therein an first sample conduit extending from a top surface of the first retaining block to a bottom surface of the first retaining block along a first conduit axis;
      a second retaining block having formed therein a second sample conduit extending from a top surface of the second retaining block to a bottom surface of the second retaining block along a second conduit axis that is aligned with the first conduit axis;
      a first conductive constraint selectively insertable in the first retaining block perpendicular to the first conduit axis to constrain the sample extending through the first sample conduit;
      a second conductive constraint selectively insertable in the second retaining block perpendicular to the second conduit axis to constrain the sample extending through the second sample conduit; and
      a dielectric support coupling the first retaining block to the second retaining block, the dielectric support extending at least from the bottom surface of the first retaining block to the top surface of the second retaining block to define a sample region therebetween;
      wherein the bottom surface of the first retaining block faces the top surface of the second retaining block across the sample region, and
      wherein the sample region is dimensioned to provide in situ imaging of the sample extending into the first sample conduit into the sample region and into the second sample conduit; and
   a fixture support connecting the fixture to a rotation stage.

13. The system of claim 12, further comprising a heater for heating the sample to a predetermined temperature during accelerated electromigration testing.

14. The system of claim 12, further comprising a power supply connected to the first and second retaining blocks to provide an electrical current across the sample.

15. The system of claim 12, further comprising an x-ray source and an x-ray detector.

16. The system of claim 12, further comprising a scanning electron microscope.

17. The system of claim 11, further comprising an optical microscope.

* * * * *

UNITED STATES PATENT AND TRADEMARK OFFICE
CERTIFICATE OF CORRECTION

PATENT NO. : 9,952,272 B2
APPLICATION NO. : 14/958354
DATED : April 24, 2018
INVENTOR(S) : Nikhilesh Chawla Page 1 of 1

It is certified that error appears in the above-identified patent and that said Letters Patent is hereby corrected as shown below:

In the Specification

Column 9, Lines 16-17, "$10^-{}_6$" should read --$10^{-6}$--.

Signed and Sealed this
Fifth Day of June, 2018

Andrei Iancu
*Director of the United States Patent and Trademark Office*